US008699731B2

(12) United States Patent

Beckinger et al.

(10) Patent No.: US 8,699,731 B2

(45) Date of Patent: Apr. 15, 2014

(54) APPARATUS AND METHOD FOR GENERATING A LOW-FREQUENCY CHANNEL

(75) Inventors: Michael Beckinger, Erfurt (DE); Sandra Brix, Ilmenau (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 2485 days.

(21) Appl. No.: 11/440,853

(22) Filed: May 25, 2006

(65) Prior Publication Data

US 2006/0280311 A1 Dec. 14, 2006

Related U.S. Application Data

(63) Continuation of application No. PCT/EP2004/013130, filed on Nov. 18, 2004.

(30) Foreign Application Priority Data

Nov. 26, 2003 (DE) .................................. 103 55 146

(51) Int. Cl.

*H04R 5/02* (2006.01)
*H03G 5/00* (2006.01)
*H04B 1/00* (2006.01)

(52) U.S. Cl.

USPC .............................. 381/307; 381/98; 381/119

(58) Field of Classification Search

USPC ............................ 381/98, 307, 310, 119, 120

See application file for complete search history.

(56) References Cited

U.S. PATENT DOCUMENTS 5,142,586 A * 8/1992 Berkhout ........................ 381/63
5,495,576 A * 2/1996 Ritchey ......................... 345/420

(Continued)

FOREIGN PATENT DOCUMENTS

EP 1 126 745 A2 8/2001 ................ H04S 3/00
JP 2296498 12/1990

(Continued)

OTHER PUBLICATIONS

Rabenstein et al., "Spatial Sound Reproduction and the MPEG-4 Standard: The CARROUSO-Project," VDT International Audio Convention, Hannover, Nov. 22-25, 2002, pp. 1-12 (no English translation).

(Continued)

*Primary Examiner* — J. Elbin

(74) *Attorney, Agent, or Firm* — Thomas | Horstemeyer, LLP

(57) ABSTRACT

For generating a low-frequency channel for a low-frequency loudspeaker arranged at a predetermined low-frequency loudspeaker position, a plurality of audio objects are initially provided, each audio object having an object position and an object description associated with it. Hereafter, a calculation of an audio object scaling value is performed for each audio object on the basis of the object description, so that an actual amplitude state at least comes close to a target amplitude state at a reference playback position. Thereafter, each object signal is scaled with an associated audio object scaling value so as to then sum the scaled object signals. From the composite signal obtained there, a low-frequency channel is subsequently derived for the low-frequency loudspeaker, and is provided to the respective low-frequency loudspeaker. Due to the scaling of the individual object signals of the audio objects, this approach is independent of an actual situation of a multichannel playback system with regard to the number and density of the loudspeakers as well as with regard to the size of the presentation area actually present.

25 Claims, 12 Drawing Sheets

(56) References Cited

U.S. PATENT DOCUMENTS

| | | | | |
|---|---|---|---|---|
| 5,715,318 A * | 2/1998 | Hill et al. | ...................... | 381/300 |
| 5,862,229 A * | 1/1999 | Shimizu | .......................... | 381/17 |
| 6,240,189 B1 | 5/2001 | Aylward | ......................... | 381/18 |
| 6,349,285 B1 * | 2/2002 | Liu et al. | ....................... | 704/500 |

FOREIGN PATENT DOCUMENTS

| | | | |
|---|---|---|---|
| JP | 03159500 | 7/1991 | |
| JP | 2001517005 | 10/2001 | |
| WO | WO 93/18630 | 9/1993 | ................ H04S 3/02 |
| WO | WO 03/071827 A2 | 8/2003 | |

OTHER PUBLICATIONS

Martens, William L., "The Impact of Decorrelated Low-Frequency Reproduction on Auditory Spatial Imagery: Are Two Subwoofers Better Than One?" AES $16^{th}$ International Conference on Spatial Sound Reproduction, Apr. 10-12, 1999, Rovaniemi, Finland, pp. 1-11.

Berkhout et al., "Acoustic control by wave field synthesis," The Journal of the Acoustical Society of America, vol. 93, No. 5, May 1993, New York, NY, pp. 2764-2778.

Horbach et al., "Real-Time Rendering of Dynamic Scenes Using Wave Field Synthesis," IEEE Proceedings of ICME 2002, pp. 517-520.

"Wellenfeldsynthese. Das Audiowiedergabesystem der Zukunft," Fraunhofer-Institut für Digitale Medientechnologie IDMT, Downloaded on May 19, 2005 from http://www.iis.fraunhofer.de/amm/download/wfs_d.pdf.

Translation of Preliminary Report on Patentability, for PCT/EP04/13130 dated Nov. 11, 2006.

Japanese Office Action dated Jul. 15, 2008, for Japanese Application 2006-540333.

* cited by examiner

FIGUR 1a
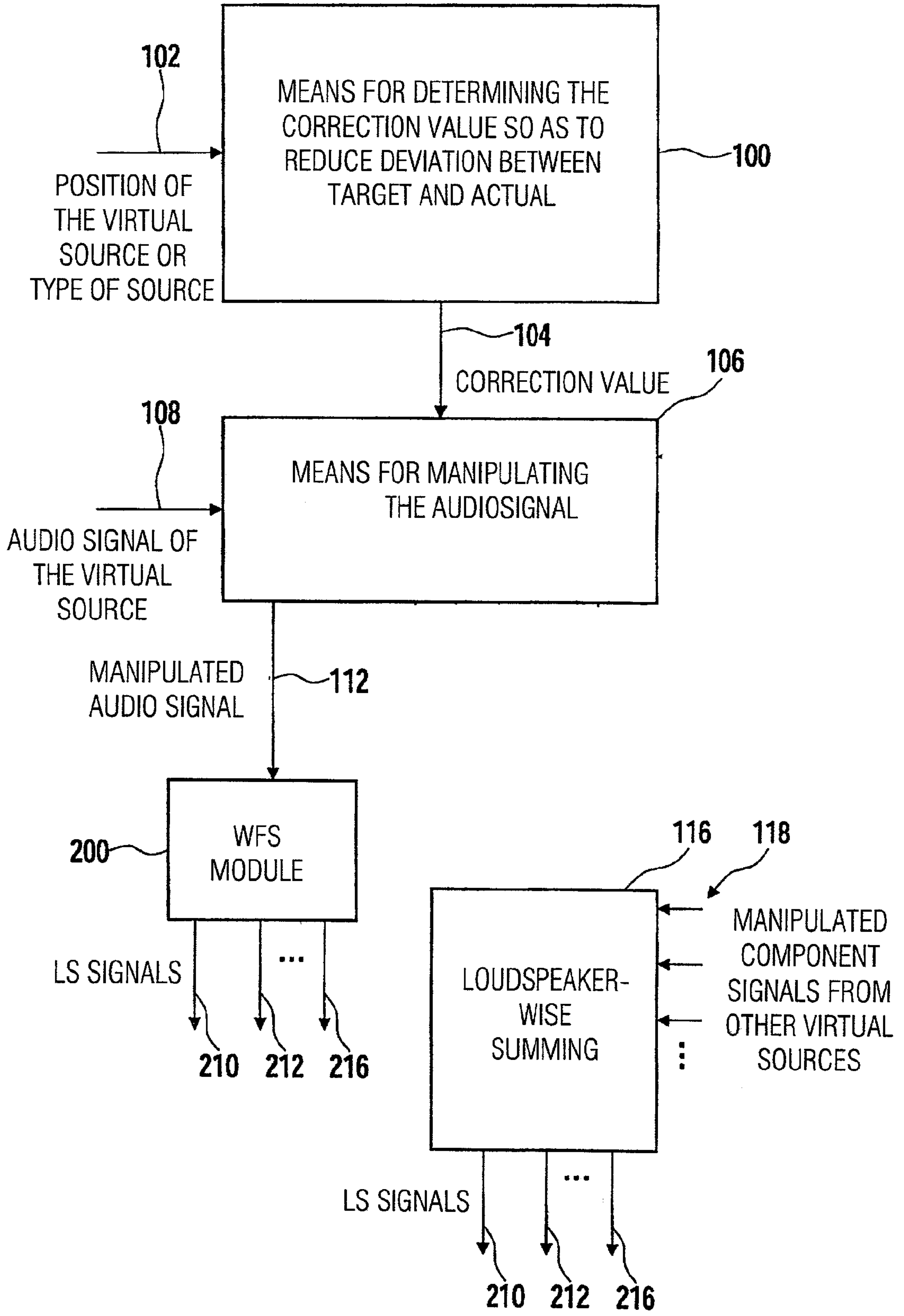

FIGUR 1b
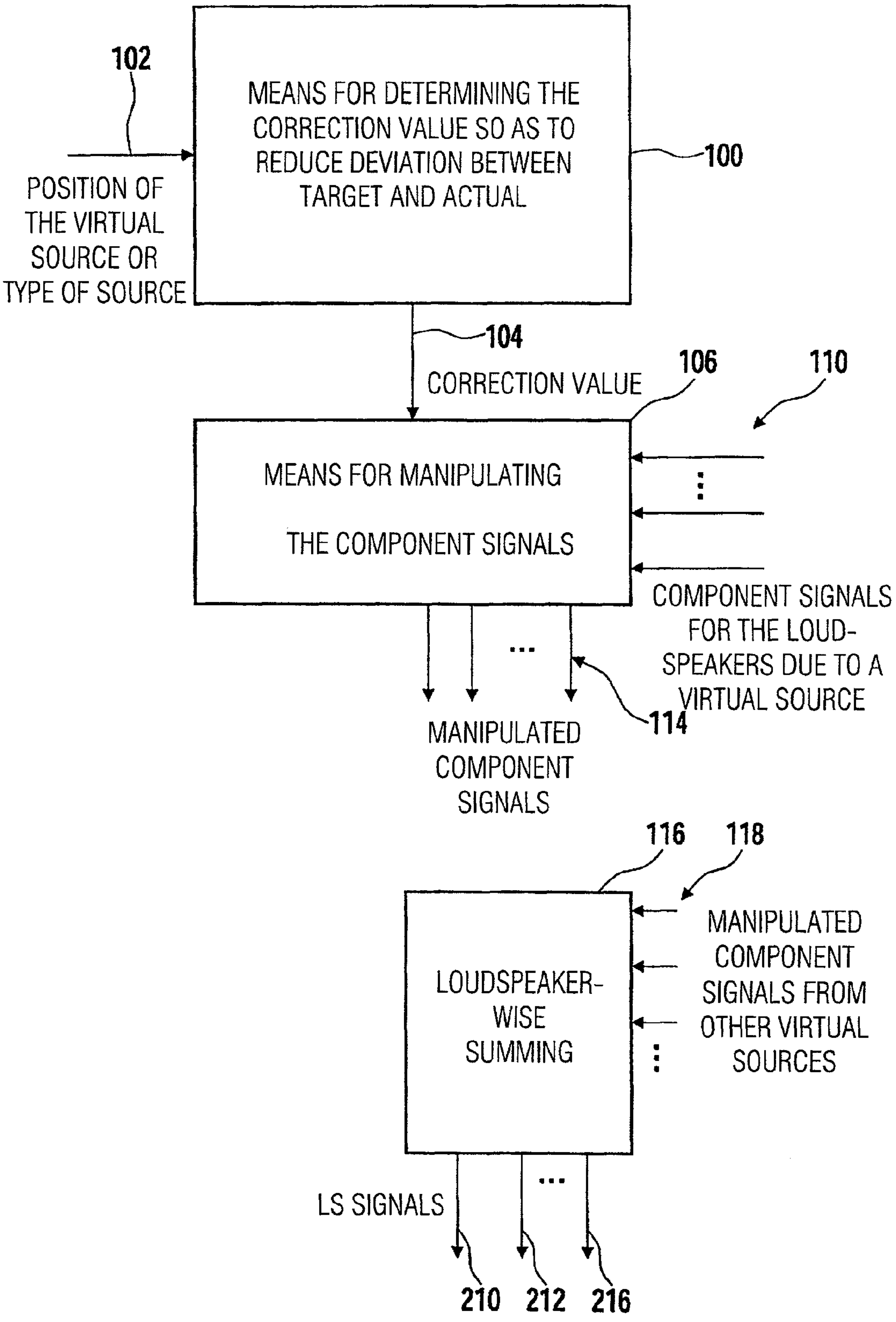

APPARATUS AND METHOD FOR GENERATING A LOW-FREQUENCY CHANNEL

CROSS-REFERENCE TO RELATED APPLICATION

This application is a continuation of copending International Application No. PCT/EP2004/013130, filed Nov. 18, 2004, which designated the United States, and was not published in English and is incorporated herein by reference in its entirety.

BACKGROUND OF THE INVENTION

1. Field of the Invention

The present invention relates to generating one or more low-frequency channels, and in particular to generating one or more low-frequency channels in connection with a multichannel audio system, such as a wave-field synthesis system.

2. Description of Prior Art

There is an increasing need for new technologies and innovative products in the area of entertainment electronics. It is an important prerequisite for the success of new multimedia systems to offer optimal functionalities or capabilities. This is achieved by the employment of digital technologies and, in particular, computer technology. Examples for this are the applications offering an enhanced close-to-reality audiovisual impression. In previous audio systems, a substantial disadvantage lies in the quality of the spatial sound reproduction of natural, but also of virtual environments.

Methods of multi-channel speaker reproduction of audio signals have been known and standardized for many years. All usual techniques have the disadvantage that both the site of the speakers and the position of the listener are already impressed on the transfer format. With wrong arrangement of the speakers with reference to the listener, the audio quality suffers significantly. Optimal sound is only possible in a small area of the reproduction space, the so-called sweet spot.

A better natural spatial impression as well as greater enclosure or envelope in the audio reproduction may be achieved with the aid of a new technology. The principles of this technology, the so-called wave-field synthesis (WFS), have been studied at the TU Delft and first presented in the late 80s (Berkout, A. J.; de Vries, D.; Vogel, P.: Acoustic control by Wave-field Synthesis. JASA 93, 1993).

Due to this method's enormous requirements for computer power and transfer rates, the wave-field synthesis has up to now only rarely been employed in practice. Only the progress in the area of the microprocessor technology and the audio encoding do permit the employment of this technology in concrete applications today. First products in the professional area are expected next year. In a few years, first wave-field synthesis applications for the consumer area are also supposed to come on the market.

The basic idea of WFS is based on the application of Huygens' principle of the wave theory:

Each point caught by a wave is starting point of an elementary wave propagating in spherical or circular manner.

Applied to acoustics, every arbitrary shape of an incoming wave front may be replicated by a large amount of speakers arranged next to each other (a so called speaker array). In the simplest case, a single point source to be reproduced and a linear arrangement of the speakers, the audio signals of each speaker have to be fed with a time delay and amplitude scaling so that the radiating sound fields of the individual speakers overlay correctly. With several sound sources, for each source the contribution to each speaker is calculated separately and the resulting signals are added. In a room with reflecting walls, reflections may also be reproduced via the speaker array as additional sources. Thus, the expenditure in the calculation strongly depends on the number of sound sources, the reflection properties of the recording room, and the number of speakers.

In particular, the advantage of this technique is that a natural spatial sound impression across a great area of the reproduction space is possible. In contrast to the known techniques, direction and distance of sound sources are reproduced in a very exact manner. To a limited degree, virtual sound sources may even be positioned between the real speaker array and the listener.

Although the wave-field synthesis functions well for environments whose properties are known, irregularities occur if the property changes or the wave-field synthesis is executed on the basis of an environment property not matching the actual property of the environment.

The technique of the wave-field synthesis, however, may also be advantageously employed to supplement a visual perception by a corresponding spatial audio perception. Previously, in the production in virtual studios, the conveyance of an authentic visual impression of the virtual scene was in the foreground. The acoustic impression matching the image is usually impressed on the audio signal by manual steps in the so-called postproduction afterwards or classified as too expensive and time-intensive in the realization and thus neglected. Thereby, usually a contradiction of the individual sensations arises, which leads to the designed space, i.e. the designed scene, to be perceived as less authentic.

In most cases, a concept is applied which is about obtaining an overall acoustic impression of the visually depicted scene. This can be described very well using the term of "total", which originates from the field of image design. This "total" sound impression mostly remains constant across all settings in a scene, even though the optical angle of view of objects undergoes big changes in most cases. For example, optical details are emphasized or de-emphasized by means of appropriate settings. Counter-shots in creating dialog in film are also not reproduced by sound.

Therefore, there is the need to acoustically embed the viewer into an audio-visual scene. Here, the screen or image area forms the viewer's line of vision and angle of view. This means that the sound is to follow the image in the sense that it always matches the image seen. This is becoming even more important particularly for virtual studios, since there is typically no correlation between the sound of, for example, presentation and the environment in which the presenter is currently located. To get an overall audio-visual impression of the scene, a spatial impression which matches the image rendered must be simulated. An essential subjective property in such a sound concept is, in this connection, the location of a sound source, such as is perceived by a viewer of, e.g., a cinema screen.

In the audio range, good spatial sound may be achieved for a large audience area by means of the technique of wave-field synthesis (WFS). As has been illustrated, wave-field synthesis is based on the Huygens principle, according to which wave fronts may be formed and built up by superposition of elementary waves. In accordance with a mathematically exact theoretical description, an infinite number of sources would have to be utilized at infinitely small distances for generating the elementary wave. In practice, however, a finite number of loudspeakers are utilized at finitely small distances from one another. Each of these loudspeakers is driven in accordance with the WFS principle, by an audio signal of a virtual source which has a certain delay and a certain level. Typically, levels and delays are different for all loudspeakers.

As has already been illustrated, the wave-field synthesis system operates on the basis of the Huygens principle and reconstructs a given waveform of, e.g., a virtual source, arranged at a certain distance from a presentation area and/or a listener in the presentation area, by means of a plurality of individual waves. Thus, the wave-field synthesis algorithm obtains information about the actual position of an individual loudspeaker from the loudspeaker array so as to then calculate, for this individual loudspeaker, a component signal which this loudspeaker ultimately must radiate off so that at the listener's end, a superposition of the loudspeaker signal from the one loudspeaker with the loudspeaker signals of the other active loudspeakers performs a reconstruction to the effect that the listener is under the impression of not being exposed to sound from many individual loudspeakers, but merely from one single loudspeaker at the position of the virtual source.

For several virtual sources in a wave-field synthesis setting, the contribution of each virtual source for each loudspeaker, i.e. the component signal of the first virtual source for the first loudspeaker, of the second virtual source for the second loudspeaker, etc., is calculated so as then to add up the component signals to eventually obtain the actual loudspeaker signal. In the event of, for example, three virtual sources, the superposition of the loudspeaker signals of all active loudspeakers at the listener would result in the listener not being under the impression that he/she is exposed to sound from a large array of loudspeakers, but that the sound that he/she hears stems merely from three sound sources which are positioned at specific positions and which are identical with the virtual sources.

In practice, the component signals are calculated mostly in that the audio signal associated with one virtual source has a delay and a scaling factor applied to it at a certain point in time, depending on the position of the virtual source and the position of the loudspeaker, to obtain a delayed and/or scaled audio signal of the virtual source which immediately represents the loudspeaker signal if there is only one virtual source, or which, after an addition with further component signals for the considered loudspeaker of other virtual sources, will then contribute to the loudspeaker signal for the loudspeaker contemplated.

Typical wave-field synthesis algorithms operate irrespective of how many loudspeakers are present in the loudspeaker array. The theory underlying wave-field synthesis is that any desired sound field may be exactly reconstructed by an infinitely high number of individual loudspeakers, the individual loudspeakers being arranged at infinitely small distances from one another. In practice, however, neither the infinitely high number nor the arrangement at infinitely small distances may be realized. Instead, there are a limited number of loudspeakers which, furthermore, are arranged at certain, predefined distances from one another. Thus, with real systems, what is achieved is only ever an approximation to the actual waveform which would occur if the virtual source were actually present, i.e. were a real source.

In addition, there are various scenarios to the effect that the loudspeaker array is arranged, if a cinema is contemplated, only e.g. at the side of the cinema screen. In this case, the wave-field synthesis module would generate loudspeaker signals for these loudspeakers, the loudspeaker signals for these loudspeakers normally being the same as those for corresponding loudspeakers in a loudspeaker array which extends, e.g., not only across that side of a cinema at which the screen is located, but which is also arranged to the left, to the right and behind the audience space. This "360°" loudspeaker array naturally will provide a better approximation to an exact wave field than merely a one-sided array, for example in front of the audience. However, the loudspeaker signals for the loudspeakers which are arranged in front of the audience are the same in both cases. This means that a wave-field synthesis module typically does not obtain any feedback as to how many loudspeakers are present and/or as to whether or not the array is a one-sided or a multi-sided or even a 360° array. In other words, a wave-field synthesis means calculates a loudspeaker signal for a loudspeaker on the basis of the position of the loudspeaker, irrespective of whether or not there are any further loudspeakers. It is true that this is a considerable advantage of the wave-field synthesis algorithm in the sense that it is modularly adjustable to various circumstances in an optimum manner, in that the coordinates of the existing loudspeakers are simply present in totally different presentation rooms. What is disadvantageous, however, is the fact that in addition to the poorer reconstruction of the current wave-field, which may be acceptable in certain circumstances, considerable level artefacts arise. For a real impression, what is crucial is not only the direction in which the virtual source is situated in relation to the listener, but also the loudness with which the listener hears the virtual source, i.e. which level "arrives" at the listener due to a specific virtual source. The level arriving at a listener which is related to a virtual source contemplated results from the superposition of the individual signals of the loudspeakers.

If one contemplates, for example, the case where a loudspeaker array of 50 loudspeakers is arranged in front of the listener, and where the audio signal of the virtual source is imaged, by the wave-field synthesis means, into component signals for the 50 loudspeakers, such that the audio signal is radiated off simultaneously by the 50 loudspeakers with various delays and various scalings, a listener to the virtual source will perceive a level of the source which results from the individual levels of the component signals of the virtual source in the individual loudspeaker signals.

If the same wave-field synthesis means is now used for a reduced array in which there are, for example, only 10 loudspeakers in front of the listener, it is readily obvious that the level of the signal from the virtual source which results at the listener's ear has decreased, since 40 component signals of the loudspeakers which are now missing are "missing", as it were.

The alternative case may also occur, in which there are loudspeakers, e.g. initially to the left and right of the listener, which are driven in an anti-phase manner in a specific constellation so that the loudspeaker signals from two opposite loudspeakers cancel each other out due to a certain delay calculated by the wave-field synthesis means. If now, in a reduced system, the loudspeakers to the one side of the listener, for example, are done away with, the virtual source suddenly appears to be substantially louder than it actually should be.

Whereas for statistical sources for level correction one might also think of constant factors, said solution will no longer be viable if the virtual sources are not static but are moving. An essential feature of wave-field synthesis is the very fact that it can also, and particularly, process moving virtual sources. A correction with a constant factor would not suffice here, since the constant factor would indeed be true for one position, but for another position of the virtual source it would act in such a manner that it would increase the artefact.

In addition, wave-field synthesis means are able to imitate several different types of sources. A prominent form of source is the point source, wherein the level decreases proportionally by 1/r, wherein r is the distance between a listener and the position of the virtual source. A different kind of source is a source which sends out plane waves. Here, the level remains constant irrespective of the distance from the listener, since plane waves may be generated by point sources arranged at infinite distances.

In accordance with the wave-field synthesis theory, with two-dimensional loudspeaker arrangements, the change of level matches the natural change of level as a function of r, except for a negligible error. However, depending on the position of the source, different errors—some of which are substantial—in the absolute level may result which result from the utilization of a finite number of loudspeakers instead of the infinite number of loudspeaker theoretically required, as has been set forth above.

A further difficulty existing with multichannel playback systems and, in particular, with wave-field synthesis systems using not only, e.g., five or seven loudspeakers, but a substantially higher number of loudspeakers, is that the loudspeakers may lead to considerable costs due to their high number. To reduce the cost of the loudspeakers, the so-called subwoofer principle is employed with such existing five-channel systems or seven-channel systems. With multichannel playback systems, the subwoofer principle serves to save expensive and large-size low-frequency loudspeakers. Here, use is made of a low-frequency channel which contains only music signals having frequencies lower than a base frequency of about 120 Hz. Said low-frequency channel drives a low-frequency loudspeaker having a large diaphragm area, which achieves high sound pressures especially at low frequencies.

The subwoofer principle makes use of the fact that human hearing has great difficulty in locating low-frequency sounds in terms of their directions. In current systems, an additional low-frequency channel for a specific loudspeaker arrangement (spatial arrangement) is mixed as early as in sound mixing. Examples of such multichannel playback systems are Dolby Digital, Sony SDDS and DTS. With these multichannel formats, the subwoofer channel may be mixed irrespective of the size of the room to be exposed to sound, since the spatial conditions change only in terms of scale. In terms of scale, the loudspeaker arrangement remains the same.

Using wave-field synthesis, a large audience area may be exposed to sound. Sound events may be reproduced at their spatial depth. To this end, the entire sound field of the individual sound events is reproduced in the audience area. This is achieved by means of a large number of loudspeakers. For large installations, about 500 or more loudspeaker systems are required. If one wanted to equip each individual loudspeaker system with a high-performance low-frequency loudspeaker, very high cost would be the result.

It has been mentioned that for existing multichannel formats, a specific loudspeaker arrangement is required in order to mix a specific subwoofer channel. However, the loudspeaker arrangement may be changed in terms of scale without having to alter the respective mix. The ratio of the distances of the individual loudspeakers from one another remains the same. However, all this is not possible with WFS, since the number of loudspeaker channels depends on the size of the area of the WFS playback system which is to be exposed to sound. This is why the individual loudspeaker channels cannot be stored, which would also be quite expensive in terms of memory if one contemplates systems with 500 or more audio channels. Therefore, only the virtual sound events to be simulated are stored. It is only at playback that the individual loudspeaker channels are calculated using the WFS algorithm.

On the one hand, the number of loudspeaker channels thus is associated with the size of the audience area. In addition, the number of loudspeaker channels is determined by the density in which the loudspeakers are distributed across the area to be exposed to sound. The quality of the WFS playback system depends on said density. The loudness is associated with the number of loudspeaker channels and the density of the loudspeakers, since, as one knows, all loudspeaker channels add up to a wave-field. The loudness of a WFS system is thus not readily predetermined. The loudness of the subwoofer channel, however, is predetermined with the known parameters of the electrical amplifier and the loudspeaker. It is therefore not possible to transfer a mix of a subwoofer channel from a WFS system to a WFS system with a different loudspeaker density and a different number of loudspeakers in an error-free manner. The loudnesses from the low-frequency system, on the one hand, and from the mid-/high-frequency system, on the other hand, would not match.

SUMMARY OF THE INVENTION

It is the object of the present invention to provide a concept for generating a low-frequency channel in a multichannel playback system which enables a reduction of level artefacts.

In accordance with a first aspect, the invention provides an apparatus for generating a low-frequency channel for a low-frequency loudspeaker, having:

a provider for providing a plurality of audio objects, an audio object having an object signal and an object description associated with it:

a calculator for calculating an audio object scaling value for each audio object in dependence on the object description;

a scaler for scaling each object signal with an associated audio object scaling value so as to obtain a scaled object signal for each audio object;

a summer for summing the scaled object signals so as to obtain a composite signal; and a provider for providing the low-frequency channel for the low-frequency loudspeaker on the basis of the composite signal.

In accordance with a second aspect, the invention provides a method for generating a low-frequency channel for a low-frequency loudspeaker, the method including the steps of:

providing a plurality of audio objects, an audio object having an object signal and an object description associated with it:

calculating an audio object scaling value for each audio object in dependence on the object description;

scaling each object signal with an associated audio object scaling value so as to obtain a scaled object signal for each audio object;

summing the scaled object signals so as to obtain a composite signal; and providing the low-frequency channel for the low-frequency loudspeaker on the basis of the composite signal.

In accordance with a third aspect, the invention provides a computer program having a program code for performing the method for generating a low-frequency channel for a low-frequency loudspeaker, the method including the steps of:

- providing a plurality of audio objects, an audio object having an object signal and an object description associated with it:
- calculating an audio object scaling value for each audio object in dependence on the object description;
- scaling each object signal with an associated audio object scaling value so as to obtain a scaled object signal for each audio object;

summing the scaled object signals so as to obtain a composite signal; and providing the low-frequency channel for the low-frequency loudspeaker on the basis of the composite signal, when the program runs on a computer.

The present invention is based on the findings that the low-frequency channel for a low-frequency loudspeaker and/or that several low-frequency channels for several low-frequency loudspeakers in a multichannel system is/are not generated as early as in a sound-mixing process taking place independently of an actual playback space, but that reference is made to the actual playback space in that the predetermined position of the low-frequency loudspeaker, on the one hand, and properties of audio objects which typically represent virtual sources, on the other hand, are also taken into account in order to generate the low-frequency channel. In particular, one operates on the basis of audio objects, an audio object being associated with an object description, on the one hand, as well as with an object signal, on the other hand. Depending on the object description, an audio object scaling value is calculated for each audio object signal, the former then being used for scaling every object signal so as to then sum up the scaled object signals to obtain a composite signal. The low-frequency channel which is supplied to the low-frequency loudspeaker is then derived from the composite signal.

For the event of sources which radiate off plane waves, wherein a position in the infinite is thus assumed, the virtual position of the source, on the one hand, as well as a reference playback position, on the other hand, for which a reference loudness is requested, are not important. However, this is not the case with common sources which are assumed to have the shapes of points, such as occur, for example in a film setting, when dialogs etc. take place. In this case, the audio object signal originating from a virtual source which is arranged at a virtual position is scaled such that an additional loudness and/or an actual amplitude state corresponds to a target amplitude state at the reference playback position due to said virtual source. The target amplitude state depends on the loudness of the audio object signal associated with the virtual source, and on the distance between the virtual position and the reference playback position. This calculation of audio object scaling values is performed for all virtual sources so as to then scale the audio object signals of each virtual source with the corresponding scaling value.

Subsequently, the scaled audio object signals are summed up to obtain a composite signal. In the case where only one single low-frequency loudspeaker is present, the low-frequency channel is then derived from said composite signal. This may be effected by means of simple low-pass filtering.

It shall be pointed out here that low-pass filtering may be effected already with the still unscaled audio object signals, so that only low-pass signals are already processed further, so that the composite signal is already the low-frequency channel itself.

However, it is preferred in accordance with the invention for the extraction of the low-frequency channel not to be performed until after the scaled object signals have been summed up, so as to obtain the best approximation possible of the loudness of the low-frequency signals in the presentation room, on the one hand, and the loudness of the mid-frequency and high-frequency signals in the presentation room, on the other hand.

In accordance with the invention, it is not as early as at the sound-mixing process that a subwoofer channel is mixed from the virtual sources, i.e. the sound material for the wave-field synthesis. Instead, the mixing is automatically performed during the playback in the wave-field synthesis system irrespective of the size of the system and the number of loudspeakers. The loudness of the subwoofer signal here depends on the number and on the size of the enclosed area of the wave-field synthesis system. Even prescribed loudspeaker arrangements no longer need to be kept to, since the loudspeaker position and the number of loudspeakers are included into generating the low-frequency channel.

The present invention is not only limited to wave-field synthesis systems, but may also generally be applied to any multichannel playback systems wherein the mixing and generation, i.e. the rendering, of the playback channels, i.e. of the loudspeaker channels themselves, do not take place until at the actual playback. Systems of this kind are, for example, 5.1 systems, 7.1 systems, etc.

Preferably, the inventive low-frequency channel generation is combined with a level artefact reduction so as to perform level corrections in a wave-field synthesis system not only for low-frequency channels, but for all loudspeaker channels so as to be independent of the number and position of the loudspeakers employed with regard to the wave-field synthesis algorithm used.

With preferred embodiments of the present invention, wherein only one single low-frequency channel, and thus one single low-frequency loudspeaker, is provided, the low-frequency loudspeaker will not be arranged in a reference playback position for which an optimum level correction is performed. In this case, the composite signal is scaled, in accordance with the invention, while taking into account the position of the low-frequency loudspeaker using a loudspeaker scaling value to be calculated. This scaling will preferably be only amplitude scaling rather than phase scaling, allowances being made for the fact that at the low frequencies present in the low-frequency channel, the ear is not good at locating, but merely exhibits accurate amplitude/loudness perception. Alternatively or additionally, phase scaling may be used as the scaling, if such scaling is desired in an application scenario.

For the event of positioning several low-frequency loudspeakers, a respective low-frequency channel is generated for each individual low-frequency loudspeaker. The low-frequency channels of the individual low-frequency loudspeakers preferably differ with regard to their amplitudes, but not with regard to the signal itself. All low-frequency loudspeakers thus send out the same composite signal, but at different amplitude scalings, the amplitude scaling for each individual low-frequency loudspeaker being effected in dependence on the distance of the individual low-frequency loudspeaker from the reference playback point. In addition, it is ensured, in accordance with the invention, that the overall loudness of all superposed low-frequency channels at the reference playback position equals the loudness of the composite signal or corresponds, at least within a predetermined tolerance range, to the loudness of the composite signal. To this end, a respective loudspeaker scaling value is calculated for each individual low-frequency channel, with which scaling value the composite signal is scaled accordingly so as to obtain the individual low-frequency channel.

The use of a subwoofer channel is particularly advantageous in that it leads to a clear price reduction, since the individual loudspeakers, e.g. of a wave-field synthesis system, may be constructed at a considerably lower price as they do not have to exhibit any low-frequency properties. On the other hand, only one or a few, e.g. three to four, subwoofer loudspeakers are sufficient to implement the very low frequencies at a high sound pressure by means of a diaphragm area of a correspondingly large size.

The present invention is further advantageous in that the one and/or the several low-frequency channels for any loudspeaker constellations and multichannel formats desired can be generated automatically, this requiring, in particular within the framework of a wave-field synthesis system, only a small additional expenditure, since the wave-field synthesis system performs a level correction anyhow.

With regard to the required number of low-frequency loudspeakers as well as the optimum positioning of one or more low-frequency loudspeakers, reference shall be made to the specialist literature, of which particular mention shall be made of Welti, Todd, "How Many Subwoofers are Enough", $112^{th}$ AES Conv. Paper 5602, May 2002, Munich, Germany, Martens, "The impact of decorrelated low-frequency reproduction on auditory spatial imagery: Are two subwoofers better than one?", $16^{th}$ AES Conf. Paper, April 1999, Rovaniemi, Finland.

In a preferred embodiment of the present invention, wherein only one single low-frequency loudspeaker is employed, the individual loudness and preferably also the delay of each virtual source, i.e. each sound object and/or audio object, is calculated in relation to the reference playback position. Subsequently, the audio signal of each virtual source is scaled and delayed accordingly, so as to then sum up all virtual sources. Thereafter, the overall loudness and delay of the subwoofer is calculated in dependence on its distance from the reference point, unless the subwoofer has already been arranged in the reference point.

In the case of several subwoofers it is preferred to initially determine the individual loudnesses of all subwoofers in dependence on their distances from the reference point. Here it is preferred to meet the boundary condition that the sum of all subwoofer channels equals that of the reference loudness at the reference playback position, which preferably corresponds to the center of the wave-field synthesis system. Thus, respective scaling factors are calculated per subwoofer, the individual loudness and delay of each virtual source initially being determined again in relation to the reference point. Subsequently, each virtual source is again scaled and optionally delayed accordingly so as to then sum up all virtual forces to form the composite signal, which is then scaled at the individual scaling factors for each subwoofer channel so as to obtain the individual low-frequency channels for the various low-frequency loudspeakers.

BRIEF DESCRIPTION OF THE DRAWINGS

These and other objects and features of the present invention will become clear from the following description taken in conjunction with the accompanying drawing, in which:

FIGS. 1*a* and 1*b* are block circuit diagrams of the inventive apparatus for level-correcting in a wave-field synthesis system;

DESCRIPTION OF PREFERRED EMBODIMENTS

Figure 2:
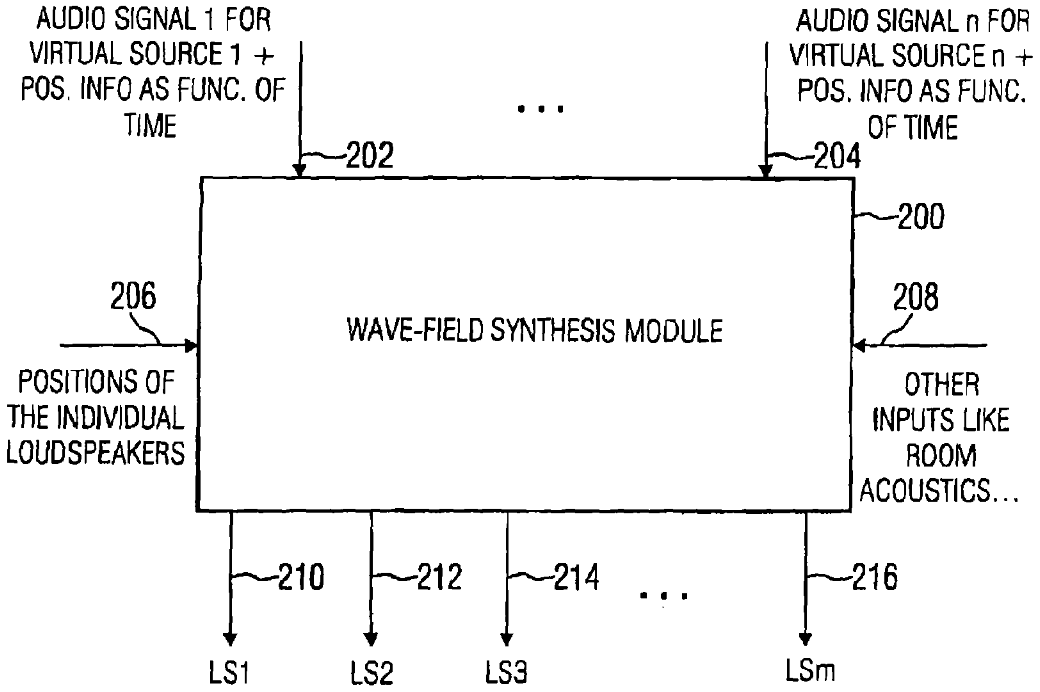
FIG. 2 is a principle circuit diagram of a wave-field synthesis environment as may be employed for the present invention.

As has already been explained, both loudness and delay are calculated for each loudspeaker channel and each virtual source by the wave-field synthesis algorithm. For this purpose, the position of the individual loudspeaker must be known. To this end it is preferred, in accordance with the invention, to scale the overall loudness of all loudspeakers at a reference point of the wave-field synthesis playback system onto an absolute reference loudness, i.e. a target amplitude state. This scaling of the individual audio object signals for the individual wave-field synthesis system loudspeakers, i.e. the individual loudspeakers of the array, is based on the findings that the inadequacies of a wave-field synthesis system may at least be alleviated with a finite number (which may be implemented in practice) of loudspeakers, when a level correction is performed, to the effect that either the audio signal associated with a virtual source is manipulated before the wave-field synthesis using a correction value, or that the component signals for various loudspeakers that can be traced back to a virtual source are manipulated after the wave-field synthesis using a correction value, so as to reduce a deviation between a target amplitude state in a presentation area and an actual amplitude state in the presentation area. The target amplitude state results from the fact that, depending on the position of the virtual source, and, e.g., depending on a distance of a listener and/or an optimum point in a presentation area from the virtual source, and, if need be, while considering the type of source, a target level is determined as an example of a target amplitude state, and that, in addition, an actual level is determined as an example of an actual amplitude state at the listener. While the target amplitude state is determined, independently of the actual grouping and type of the individual loudspeakers, merely on the basis of the virtual source and/or its position, the actual situation is calculated while considering the positioning, type and drive of the individual loudspeakers of the loudspeaker array.

Thus, the sound level at the listener's ear may be determined at the optimum point within the presentation area due to a component signal of the virtual source which is radiated off via an individual loudspeaker. Accordingly, for the other component signals originating from the virtual source and being radiated off via other loudspeakers, the level at the listener's ear may also be determined at the optimum point within the presentation area, so as to then obtain the actual level at the listener's ear by combining these levels. To this end, the transmission function of each individual loudspeaker as well as the level of the signal at the loudspeaker and the distance of the listener at the point considered within the presentation area from the individual loudspeaker may be taken into account. For simpler configurations, the transmitting characteristic of the loudspeaker may be assumed to be such that it works as an ideal point source. However, for more complicated implementations, the directional characteristic of the individual loudspeaker may also be taken into account.

A substantial advantage of this concept is that in one embodiment in which sound levels are contemplated, only multiplicative scalings occur, to the effect that for a quotient between the target level and the actual level, which results in the correction value, neither the absolute level at the listener nor the absolute level of the virtual source are necessary. Instead, the correction factor depends merely on the position of the virtual source (and thus on the positions of the individual loudspeakers) as well as of the optimum point within the presentation area. These magnitudes, however, are fixedly predefined with regard to the position of the optimum point and to the positions and transmission characteristics of the individual loudspeakers and are not dependent on a track played back.

Therefore, the concept may be implemented as a look-up table in a manner which is effective in terms of computing time, to the effect that what is created and used is a look-up table which includes position/correction-factor value pairs, to be precise for all, or a substantial part of, the possible virtual positions. In this case, no on-line target value determination, actual value determination and target value/actual value comparison algorithm needs to be performed. These algorithms, which possibly are expensive in terms of computing time, can be dispensed with if the look-up table is accessed on the basis of a position of a virtual source in order to determine, from there, the correction factor valid for said position of the virtual source. To further increase the computation and storage efficiency, it is preferred to store pairs of support values—which are rastered relatively coarsely—for positions and associated correction factors in the table, and to perform one-sided, two-sided, linear, cubic etc. interpolations on correction factors for position values interposed between two support values.

Alternatively, it may also make sense in one case or another to employ an empirical approach in the sense that level measurements are conducted. In such a case, a virtual source with a certain calibration level would be placed at a certain virtual position. Then, for a real wave-field synthesis system, a wave-field synthesis module would calculate the loudspeaker signals for the individual loudspeakers so as to eventually measure, at the listener, the level actually arriving due to the virtual source. A correction factor would then be determined to the effect that it at least reduces, or preferably brings down to 0, the deviation from the target level to the actual level. This correction factor would then be stored in the look-up table, in association with the position of the virtual source, so as to generate the entire look-up table little by little, i.e. for many positions of the virtual source, for a specific wave-field synthesis system in a specific presentation room.

There are several possibilities of manipulation on the basis of the correction factor. In one embodiment it is preferred to manipulate the audio signal of the virtual source, as is recorded, for example, in an audio track coming from a sound studio, with the correction factor so as to only then feed the manipulated signal into a wave-field synthesis module. This automatically, as it were, results in the fact that all component signals originating from this manipulated virtual source are thus also weighted accordingly, specifically in comparison with the case where no correction in accordance with the present invention has been conducted.

Alternatively, it may also be favorable, for certain cases of application, not to manipulate the original audio signal of the virtual source, but to manipulate the component signals generated by the wave-field synthesis module so as to preferably manipulate all of these component signals with the same correction factor. It should be noted at this point that the correction factor need not necessarily be identical for all component signals. However, this is preferred by many so as not to compromise too much the relative scaling of the component signals, which are required for reconstructing the actual source situation, with regard to each other.

An advantage is that, with relatively simple steps, a level correction may be performed, at least during operation, to the effect that the listener does not notice, at least with regard to the loudness of a virtual source perceived by him/her, that rather than the infinitely high number of loudspeakers which would actually be required, only a limited number of loudspeakers are present.

A further advantage is that, even when a virtual source moves (e.g. from the left to the right) within a distance which remains the same in relation to the viewer, this source always has the same loudness for the viewer seated, for example, centrally in front of the screen, and is not louder at one time and quieter at another time, which would be the case without correction.

A further advantage is that it provides the option of offering less expensive wave-field synthesis systems having smaller numbers of loudspeakers which, however, do not entail any level artefacts, in particular with moving sources, i.e. which have the same positive effect for a listener with regard to the level problem as more expensive wave-field synthesis systems having a high number of loudspeakers. Any levels which may be too low can be corrected, in accordance with the invention, even for holes in the array.

Before a detailed description will be given of the above-described preferred manner of level artefact correction, a representation shall be initially given by means of FIG. 9 of the inventive concept of generating a low-frequency channel, which concept may be employed either on its own, i.e. without any level correction of the individual loudspeakers, or may preferably be combined with the concept of level artefact correction, which will be described later on with reference to FIGS. 1 to 8, so as to use the correction values, which are used for level artefact correction of the individual loudspeakers, also as audio object scaling values which have to be employed in the generation of low-frequency channels.

Figure 9:
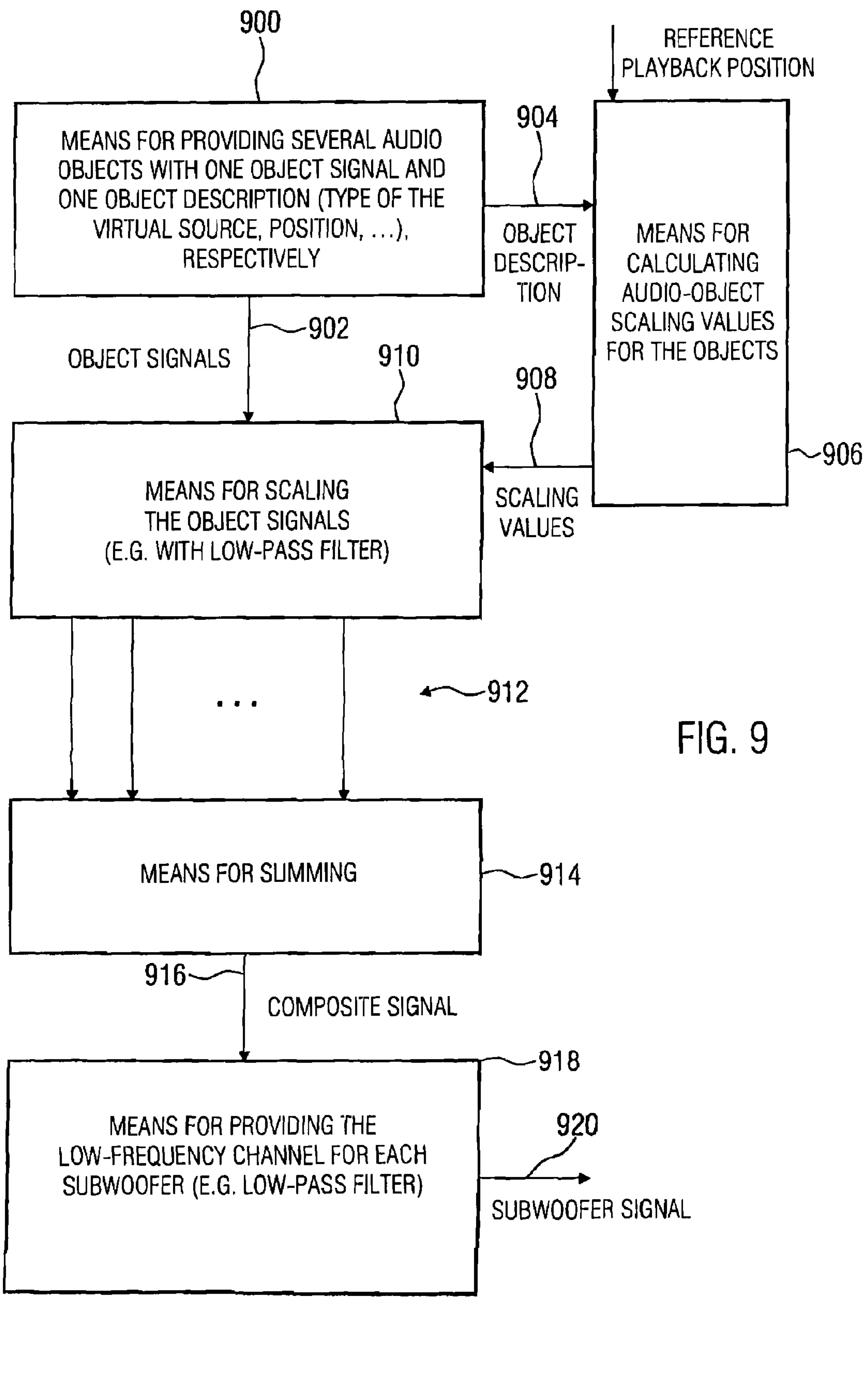
FIG. 9 is a block circuit diagram of an inventive apparatus for generating a low-frequency channel.

FIG. 9 shows an apparatus for generating a low-frequency channel for a low-frequency loudspeaker arranged at a predetermined loudspeaker position. The apparatus shown in FIG. 9 initially includes a means 900 for providing a plurality of audio objects, one audio object having an audio object signal 902 as well as an audio object description 904 associated with it. The audio object description typically includes an audio object position and possibly also the type of audio object. Depending on the embodiment, the audio object description may also directly include an indication regarding the audio object loudness. If this is not the case, the audio object loudness may be readily calculated from the audio object signal itself, for example by means of sample-wise squaring and summing-up over a certain period of time. If the transmission functions, frequency responses etc. of the individual loudspeakers contemplated or even of the low-frequency loudspeaker are to be taken into account as early as at this point, this will also be realizable by means of a simple table look-up and/or a correction factor, since in a playback system, the electrical behavior of the loudspeaker and/or the signal/sound characteristic of the loudspeaker is a stationary quantity.

The object description of the audio signal is supplied to a means 906 for calculating an audio object scaling value for each audio object. The individual audio object scaling values 908 are then supplied to a means 910 for scaling the object signals, as is shown in FIG. 9. Means 906 for calculating the audio object scaling values is configured to calculate an audio object scaling value for each audio object in dependence on the object description. If what is dealt with is a source sending out plane waves, the audio object scaling value and/or the correction factor will equal 1, since for such plane-wave audio objects, a spacing between the position of this object and the optimum reference playback position is irrelevant, since the virtual position will be assumed to be in the infinite in this case.

However, if the audio object is a virtual source radiating off in a point-shaped manner and positioned at a virtual position, the audio object scaling value is calculated in dependence on the object loudness which is to be found either in the object description or to be derived from the object signal, and on the distance between the virtual position of the audio object and the reference playback position.

In particular, it is preferred to calculate the audio object scaling value and/or correction value such that the fact that the same is based on a target amplitude state in the presentation area is taken into account, the target amplitude state being dependent on a position of the virtual source or a type of the virtual source, the correction value further being based on an actual amplitude state in the presentation area which is based on the component signals for the individual loudspeakers due to the virtual source contemplated. Thus, the correction value is calculated such that by manipulating of the audio signal associated with the virtual source using the correction value, a deviation between the target amplitude state and the actual amplitude state is reduced. After scaling the object signals, which scaling is performed by means 910, so as to obtain the scaled object signals 912, same are supplied to a means 914 for summing so as to generate a composite signal 916.

As has been illustrated, it is preferred to also take into account, prior to the summation by means 914, any delay which may be due to different virtual positions, so that the individual audio object signals, which exist as sequences of samples, are shifted with regard to a time reference so as to make sufficient allowance for run-time differences of the sound signal from the virtual position to the reference playback position. After scaling and making allowance for the delay, the object signals which have been scaled and delayed accordingly will then be summed in a sample-wise manner by means 914 so as to obtain a composite signal having a sequence of composite signal samples which is indicated by 916 in FIG. 9. Said composite signal 916 is supplied to a means 918 for providing the low-frequency channel for the one and/or the several subwoofers, which means provides the subwoofer signal and/or the low-frequency channel 920 at its output side.

As has been illustrated, the sound signal sent out by a low-frequency loudspeaker is not a sound signal having a full bandwidth, but a sound signal having a bandwidth with an upper limit. In one embodiment it is preferred that the cutoff frequency of the sound signal sent out by a low-frequency loudspeaker be smaller than 250 Hz and preferably be even as low as 125 Hz. The bandwidth limitation of this sound signal may occur at various locations. A simple measure is to feed the low-frequency loudspeaker with an excitation signal having the full bandwidth, which will then be band-limited by the low-frequency loudspeaker itself, since the latter converts only low frequencies into sound signals, but suppresses high frequencies.

Alternatively, the bandwidth limitation may also occur in means 918 for providing the low-frequency channel, in that the signal there is low-pass filtered prior to a digital/analog conversion, said low-pass filtering being preferred, since it can be conducted on the digital side, so that there are clear-cut conditions independently of the actual implementation of the subwoofer. Alternatively, however, low-pass filtering may already occur upstream from means 910 for scaling the object signals, so that the operations conducted by means 910, 914, 918 are now performed with low-pass signals rather than signals of the entire bandwidth.

However, it is preferred, in accordance with the invention, to perform low-pass filtering in means 918, so that the calculation of the audio object scaling values, the scaling of the object signals, and the summation are performed with signals of full bandwidths so as to ensure as good a match of the loudspeakers as possible between low-frequency tones, on the one hand, and mid-frequency tones and high-frequency tones, on the other hand. In other words, it is preferred to perform as many operations as possible in parallel for determining the actual loudspeaker signals for the loudspeakers in the wave-field array, and to not perform a "splitting-off" of the low-frequency channel until at a very late point in time.

Figure 10:
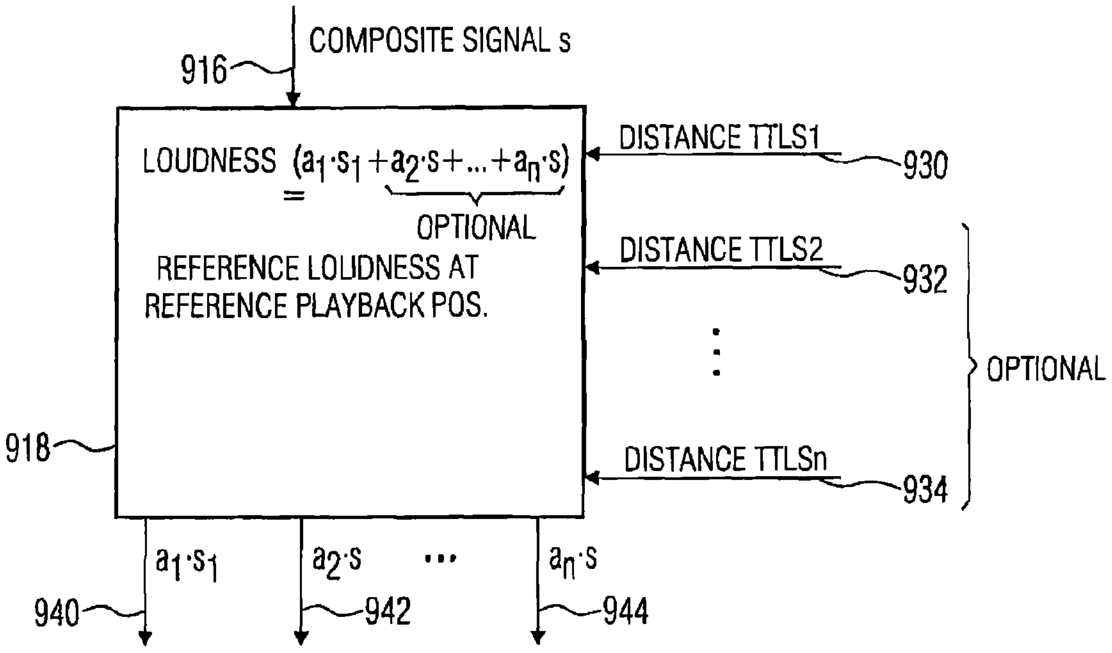
FIG. 10 is a preferred configuration of the means for providing the low-frequency channel for several low-frequency loudspeakers.
Figure 11:
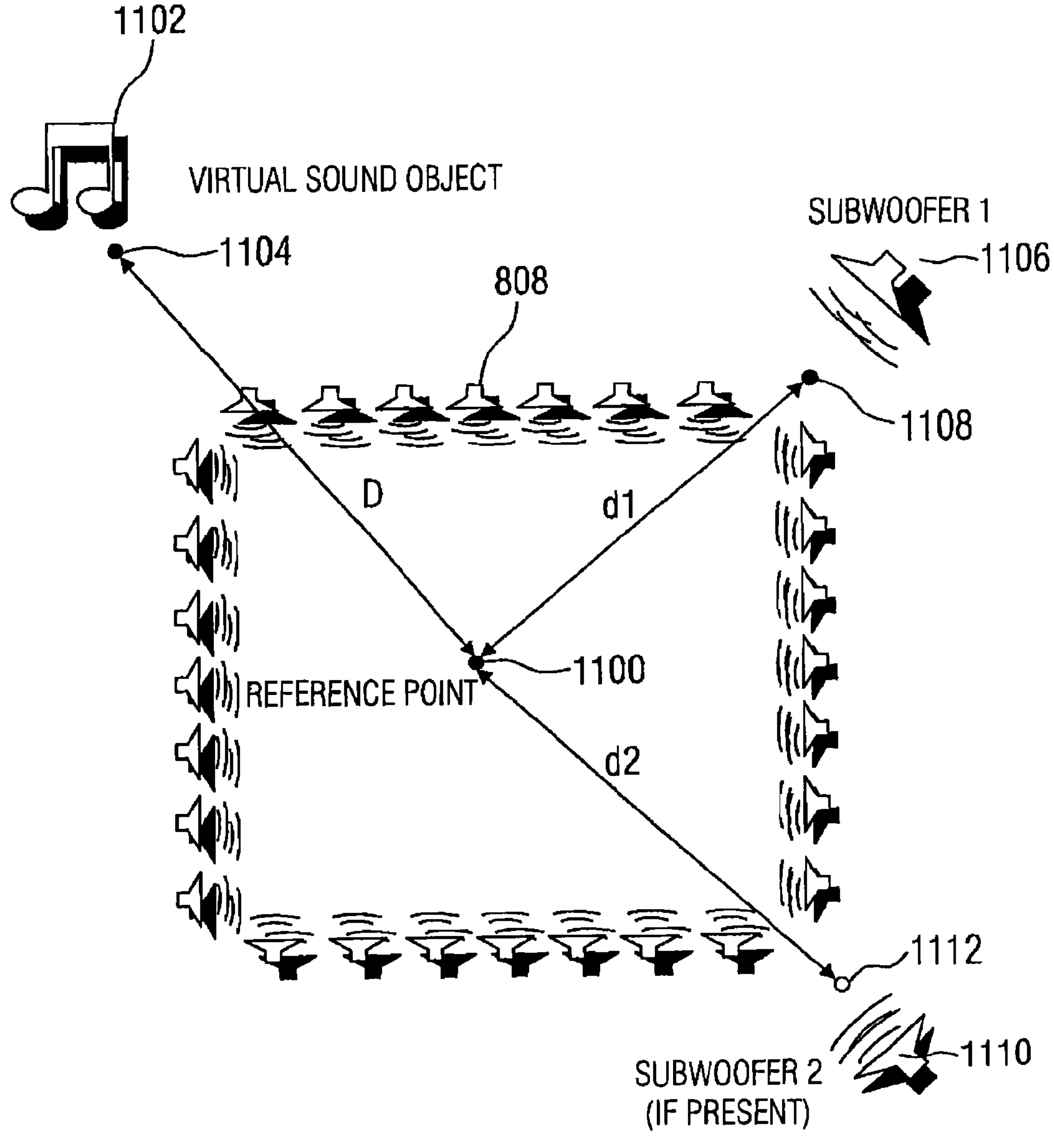
FIG. 11 is a schematic representation of a presentation area with a plurality of individual loudspeakers as well as two subwoofers.

FIG. 10 shows a preferred embodiment of means 918 for the provision of several low-frequency channels for several subwoofers. Before reference shall be made in detail to FIG. 10, a representation will initially be given of the geometrical situation using FIG. 11. FIG. 11 is a schematic representation of a wave-field synthesis system having a plurality of individual loudspeakers 808. The individual loudspeakers 808 form an array 800 of individual loudspeakers which enclose the presentation area. The reference playback position and/or the reference point 1100 is preferably located within the presentation area.

In addition, FIG. 11 shows an audio object 1102 referred to as a "virtual sound object". The virtual sound object 1102 includes an object description representing a virtual position 1104. Using the coordinates of reference point 1100 and the coordinates of the virtual position 1104, which may be convertable accordingly, if need be, the distance D of the virtual sound object 1102 from the reference playback position 1100 may be determined. A simple audio object scaling value calculation may already be conducted using this distance D, i.e. by means of the law which will be explained in detail later on in FIG. 7*a*. FIG. 11 also shows a first low-frequency loudspeaker 1106 at a first predetermined loudspeaker position 1108, as well as a second low-frequency loudspeaker 1110 at a second low-frequency loudspeaker position 1112. As is illustrated in FIG. 11, the second subwoofer 1110 and/or each further additional subwoofer, not represented in FIG. 11, is optional. The first subwoofer 1106 has a distance d1 from reference point 1100, whereas the second subwoofer 1110 has a distance d2 from the reference point. By analogy herewith, a subwoofer n (not shown in FIG. 11) has a distance dn from reference point 1100.

Referring again to FIG. 10, means 918 for providing the low-frequency channel is configured to receive, in addition to composite signal 916, referred to by s in FIG. 10, the distance d1 of the low-frequency loudspeaker 1, referred to by 930, the distance d2 of low-frequency loudspeaker 2, referred to by 932, as well as the distance dn of low-frequency loudspeaker n, referred to by 934. On the output side, means 918 provides a first low-frequency channel 940, a second low-frequency channel 942 as well as an $n^{th}$ low-frequency channel 944. It may be seen from FIG. 10 that all low-frequency channels 940, 942, 944 are weighted versions of the composite signal 916, the respective weighting factors being designated by $a_1$, $a_2$, . . . , $a_n$. The individual weighting factors $a_1$, $a_2$, . . . , $a_n$ depend on the distances 930-934, on the one hand, as well as on the general boundary condition stating that the loudness of the low-frequency channels at reference point 1100 corresponds to the reference loudness, i.e. to the target amplitude state for the low-frequency channel at the reference playback position 1100 (FIG. 11), on the other hand. Since all subwoofers are located at a distance from reference point 1100, the sum of the loudspeaker scaling values $a_1$, $a_2$, . . . , $a_n$ will be larger than 1 to make adequate allowance for the damping of the low-frequency channels on the route from the respective subwoofer to the reference point. If only one single low-frequency loudspeaker (e.g. 1106) is provided, the scaling factor $a_1$ will also be larger than 1, while no further scaling factors are to be calculated, since only one single low-frequency loudspeaker is present.

Figure 7A:
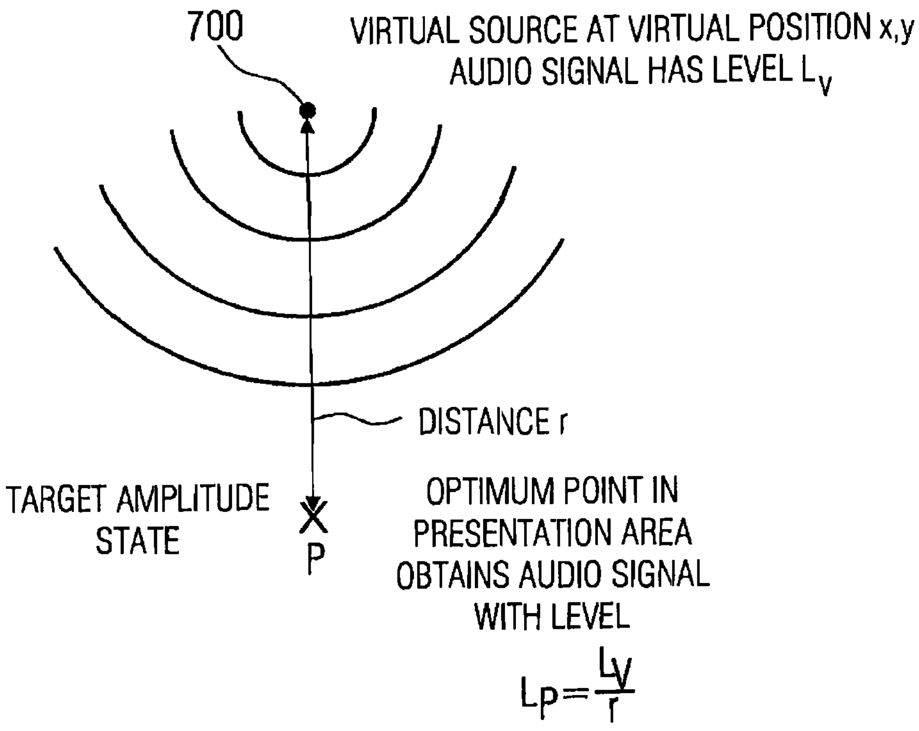
FIG. 7*a* is a schematic for illustrating the target amplitude state at an optimum point in a presentation area.
Figure 7B:
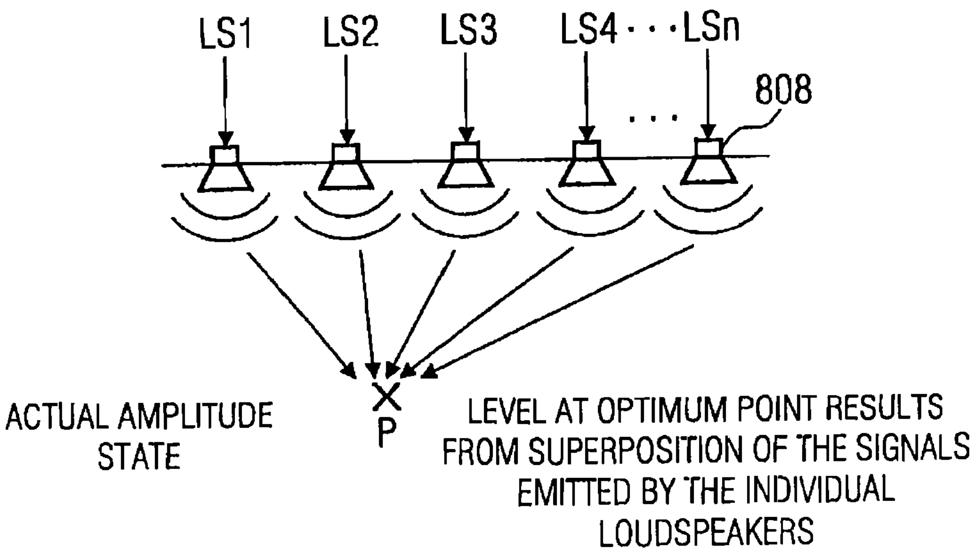
FIG. 7*b* is a schematic for illustrating the actual amplitude state at an optimum point in the presentation area.
Figure 8:
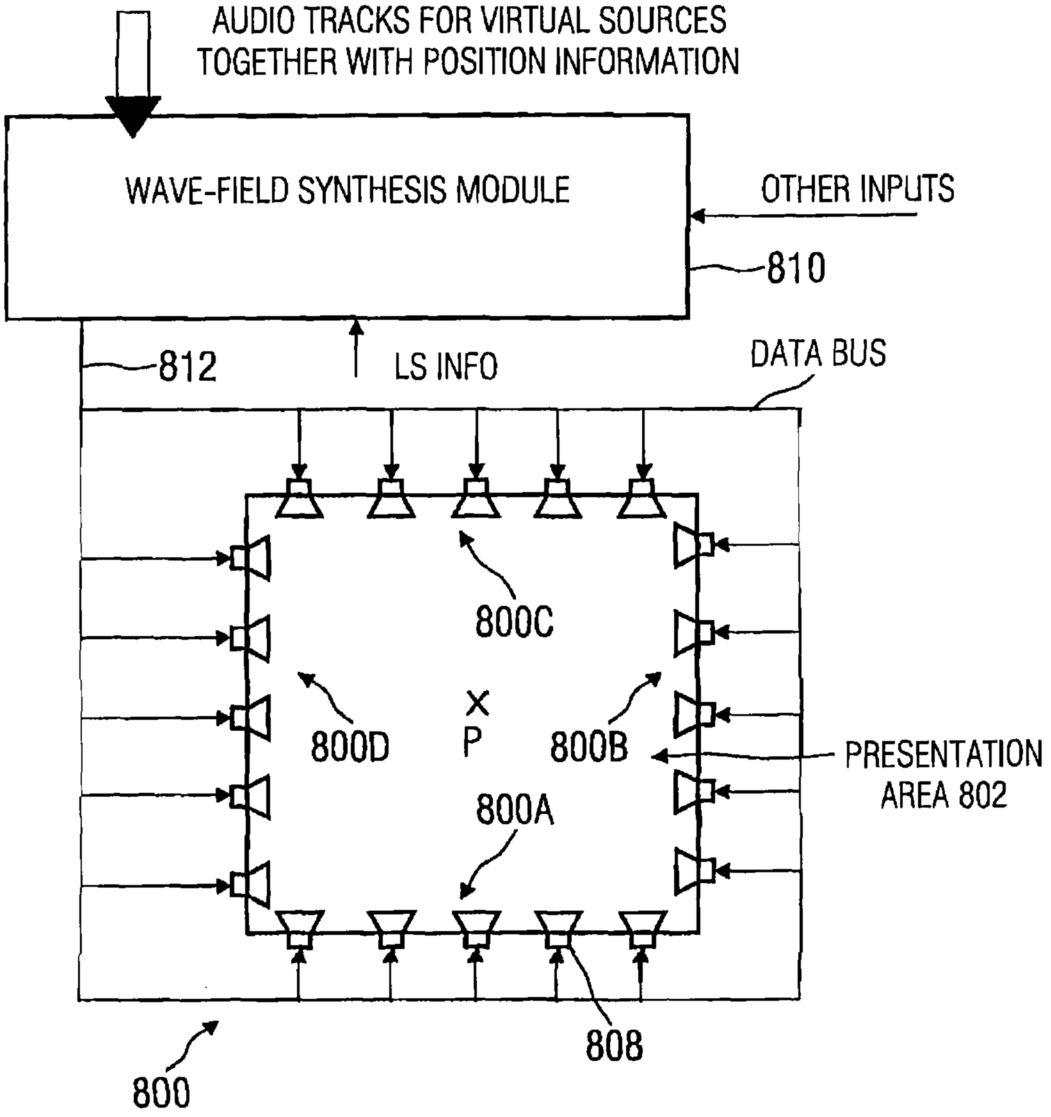
FIG. 8 is a principle block circuit diagram of a wave-field synthesis system with a wave-field synthesis module and a loudspeaker array in a presentation area.

With reference to FIGS. 1-8, a level artefact correction apparatus for the loudspeaker array 800 in FIG. 8 and/or FIG. 11 will be presented which may preferably be combined with the inventive low-frequency channel calculation, as has been represented with reference to FIGS. 9-11.

Before the present invention will be described in detail, the basic architecture of a wave-field synthesis system will be presented with regard to FIG. 8. The wave-field synthesis system has a loudspeaker array 800 located in relation to a presentation area 802. In particular, the loudspeaker array shown in FIG. 8, which is a 360° array, includes four array sides 800*a*, 800*b*, 800*c* and 800*d*. If the presentation area 802 is, e.g., a cinema hall, it shall be assumed, with regard to the conventions of front/back or right/left, that the cinema screen is located on the same side of the presentation area 802 on which the partial array 800*c* is arranged. In this case, the viewer, who is seated at what here is called the optimum point P in the presentation area 802, would look to the front, i.e. onto the screen. The partial array 800*a* would be located behind the viewer, whereas the partial array 800*d* would be located to the left of the viewer, and the partial array 800*b* would be located to the right of the viewer. Each loudspeaker array consists of a number of different individual loudspeakers 808, driven by loudspeaker signals of their own, respectively, which are provided by a wave-field synthesis module 810 via a data bus 812 which is shown only schematically in FIG. 8. The wave-field synthesis module is configured to calculate loudspeaker signals for the individual loudspeakers 808 using the information about, e.g., types and positions of the loudspeakers in relation to the presentation area 802, i.e. using loudspeaker information (LS info), and, if need be, with other inputs, said loudspeaker signals being derived, in each case, from the audio tracks for virtual sources, which further have position information associated with them, in accordance with the known wave-field synthesis algorithms. In addition, the wave-field synthesis module may obtain further inputs, such as information about the room acoustics of the presentation area, etc.

The following illustrations on the present invention may be conducted, in principle, for each point P in the presentation area. Thus, the optimum point may be located at any position within the presentation area 802. There may also be several optimum points, e.g. on an optimum line. However, to obtain as good conditions as possible for as many points as possible in the presentation area 802, it is preferred to assume the optimum point and/or the optimum line at the center and/or at the center of gravity of the wave-field synthesis system defined by the partial loudspeaker arrays 800*a*, 800*b*, 800*c*, 800*d*.

A more detailed representation of the wave-field synthesis module 800 will be given below using FIGS. 2 and 3 with reference to the wave-field synthesis module 200 in FIG. 2 and/or to the arrangement represented in detail in FIG. 3.

FIG. 2 shows a wave-field synthesis environment in which the present invention may be implemented. The center of a wave-field synthesis environment is a wave-field synthesis module 200 which includes various inputs 202, 204, 206 and 208 as well as various outputs 210, 212, 214, 216. Via inputs 202 to 204, the wave-field synthesis module is fed various audio signals for virtual sources. Input 202 receives, for example, an audio signal of virtual source 1 as well as associated position information of the virtual source. In a cinema setting, for example, audio signal 1 would be, e.g., the speech of an actor who moves from a left-hand side of the screen to a right-hand side of the screen and possibly also away from the viewer or toward the viewer. The audio signal 1 then would be the actual speech of said actor, whereas the position information as a function of time represents the current position, at a certain point in time, of the first actor in the recording setting. On the other hand, the audio signal n would be the speech of, for example, a further actor who moves in the same way as or differently than the first actor. The current position of the other actor, who has the audio signal n associated with him/her, is communicated to the wave-field synthesis module 200 by means of position information synchronized with the audio signal n. In practice, there are various virtual sources, depending on the recording setting, the audio signal of each virtual source being fed to the wave-field synthesis module 200 as an audio track of its own.

As has been set forth above, a wave-field synthesis module feeds a plurality of loudspeakers LS1, LS2, LS3, LSm by outputting loudspeaker signals to the individual loudspeakers via outputs 210 to 216. The positions of the individual loudspeakers in a playback setting, such as a cinema hall, are communicated to the wave-field synthesis module 200 via input 206. In a cinema hall, many individual loudspeakers are grouped around the cinema viewer, said loudspeakers being arranged in arrays preferably such that loudspeakers are positioned both in front of the viewer, i.e., for example, behind the screen, and behind the viewer, as well as to the right and to the left of the viewer. In addition, other inputs, such as information about the room acoustics, etc., may be communicated to the wave-field synthesis module 200 so as to be able to simulate, in a cinema hall, the actual room acoustics prevailing during the recording setting.

Generally speaking, the loudspeaker signal which is supplied, e.g., to loudspeaker LS1 via output 210, will be a superposition of component signals of the virtual sources, to the effect that the loudspeaker signal for the loudspeaker LS1 includes a first component originating from the virtual source 1, a second component originating from the virtual source 2, as well as an $n^{th}$ component originating from the virtual source n. The individual component signals are superposed in a linear manner, i.e. added after having been calculated, so as to imitate the linear superposition at the ear of the listener, who will hear, in a real setting, a linear superposition of the sound sources perceivable by him/her.

In the following, a more detailed configuration of the wave-field synthesis module 200 will be set forth with reference to FIG. 3. Wave-field synthesis module 200 has a highly parallel architecture to the effect that, starting from the audio signal for each virtual source, and starting from the position information for the respective virtual source, delay information $V_i$ as well as scaling factors $SF_i$ are initially calculated which depend on the position information and the position of the loudspeaker currently contemplated, i.e. the loudspeaker bearing the ordinal number j, i.e. LSj. Calculation of delay information $V_i$ as well as of a scaling factor $SF_i$ on the basis of the position information of a virtual source and the position of the loudspeaker j contemplated is effected by known algorithms implemented in means 300, 302, 304, 306. On the basis of the delay information $V_i$ (t) and $SF_i$ (t) as well as on the basis of the audio signal $AS_i(t)$ associated with the individual virtual source, a discrete value $AW_i(t_A)$ is calculated, for a current point in time $t_A$, for the component signal $K_{ij}$ in an loudspeaker signal eventually obtained. This is effected by means 310, 312, 314, 316, as are schematically illustrated in FIG. 3. In addition, FIG. 3 shows a "flash-light shot", as it were, at the point in time $t_A$ for the individual component signals. The individual component signals then are summed by a summer 320 to determine the discrete value for the current point in time $t_A$ of the loudspeaker signal for the loudspeaker j, which can then be supplied to the loudspeaker for the output (for example output 214, if loudspeaker j is the loudspeaker LS3).

Figure 3:
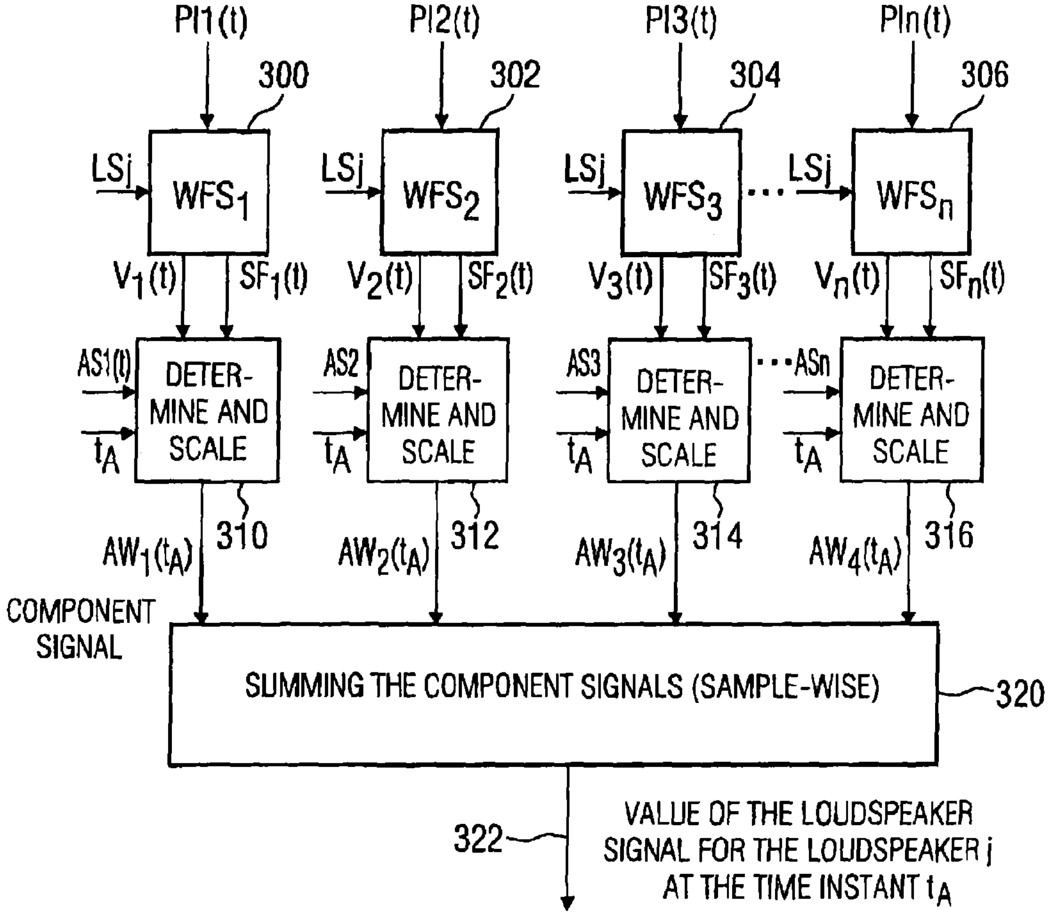
FIG. 3 is a more detailed illustration of the wave-field synthesis environment shown in FIG. 2.

As may be seen from FIG. 3, a value is initially calculated individually for each virtual source, the value being valid at a current point in time due to a delay and a scaling with a scaling factor, whereupon all component signals for a loudspeaker due to the different virtual sources are summed. If only one virtual source were present, for example, the summer would be dispensed with, and the signal applied at the output of the summer in FIG. 3 would correspond, for example, to that signal which is output by means 310 if virtual source 1 is the only virtual source.

It is to be noted at this point that at output 322 of FIG. 3, the value of a loudspeaker signal is obtained which is a superposition of the component signals for this loudspeaker due to the different virtual sources 1, 2, 3, . . . , n. An arrangement shown in FIG. 3 would be provided, in principle, for each loudspeaker 808 in the wave-field synthesis module 810, with the exception that, as is preferred for practical reasons, e.g. 2, 4 or 8 loudspeakers which are grouped together are driven with the same loudspeaker signal in each case.

FIGS. 1*a* and 1*b* show block circuit diagrams of the inventive apparatus for level-correcting in a wave-field synthesis system which has been set forth with reference to FIG. 8. The wave-field synthesis system includes wave-field synthesis module 810 as well as loudspeaker array 800 for exposing the presentation area 802 to sound, wave-field synthesis module 810 being configured to receive an audio signal associated with a virtual sound source, as well as source position information associated with the virtual sound source, and to calculate component signals for the loudspeakers due to the virtual source while taking into account loudspeaker position information. The inventive apparatus initially includes a means 100 for determining a correction value based on a target amplitude state in the presentation area, the target amplitude state depending on a position of the virtual source or a type of the virtual source, and wherein the correction value is further based on an actual amplitude state in the presentation area which depends on the component signals for the loudspeakers due to the virtual source.

Means 100 has an input 102 for obtaining a position of the virtual source if it has, e.g., a point-source characteristic, or for obtaining information about a type of the source if the source is, e.g., a source for generating plane waves. In this case, the distance of the viewer from the source is not required for determining the actual state, since, due to the plane waves generated, the source is thought, in the model, to be located at an infinitely large distance from the listener and to have a position-independent level. Means 100 is configured to output, at the output side, a correction value 104 fed to a means 106 for manipulating an audio signal associated with the virtual source (the audio signal being received via an input 108), or for manipulating component signals for the loudspeakers due to a virtual source (which are received via an input 110). If the alternative of manipulating the audio signal, provided via input 108, is conducted (FIG. 1*a*), what results at an output 112 is a manipulated audio signal which will then be fed into wave-field synthesis module 200, in accordance with the invention, instead of the original audio signal provided at input 108, so as to generate the individual loudspeaker signals 210, 212, . . . , 216.

If, however, the other alternative of manipulating has been used, i.e. the embedded, as it were, manipulation of the component signals obtained via input 110 (FIG. 1*b*), one will obtain, at the output side, manipulated component signals which still have to be summed loudspeaker by loudspeaker (means 116), specifically with possibly manipulated component signals from other virtual sources provided by further inputs 118. At the output side, means 116 again provides loudspeaker signals 210, 212, . . . , 216. It shall be pointed out that the alternatives, shown in FIG. 1, of upstream manipulation (output 112) or of embedded manipulation (output 114) may be employed as alternatives to one another. Depending on the embodiment, however, there may also be cases where the weighting factor and/or correction value provided to means 106 via input 104 is split, as it were, so that in part, an upstream manipulation and, in part, an embedded manipulation are conducted.

With regard to FIG. 3, the upstream manipulation would thus consist in that the audio signal of the virtual source, which is fed into a means 310, 312, 314 and/or 316 is manipulated before being fed in. The embedded manipulation, on the other hand, would consist in that the component signals output by means 310, 312, 314 and/or 316 are manipulated before being summed so as to obtain actual loudspeaker signals.

Figure 6A:
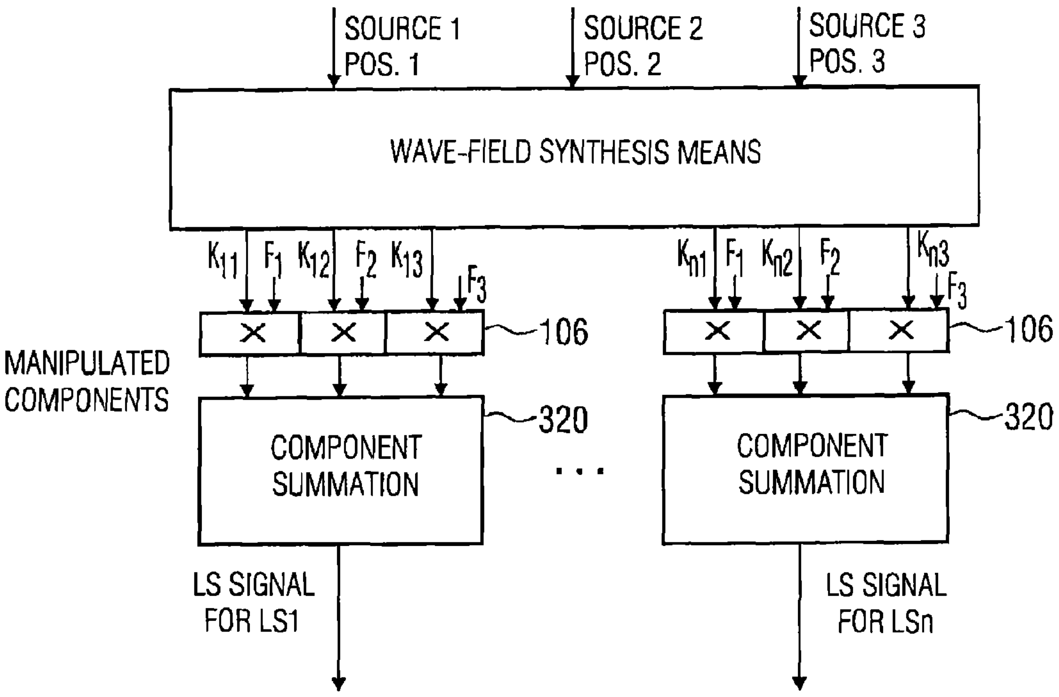
FIG. 6*a* is a block circuit diagram of a wave-field synthesis module with an embedded manipulation means for manipulating the component signals.
Figure 6B:
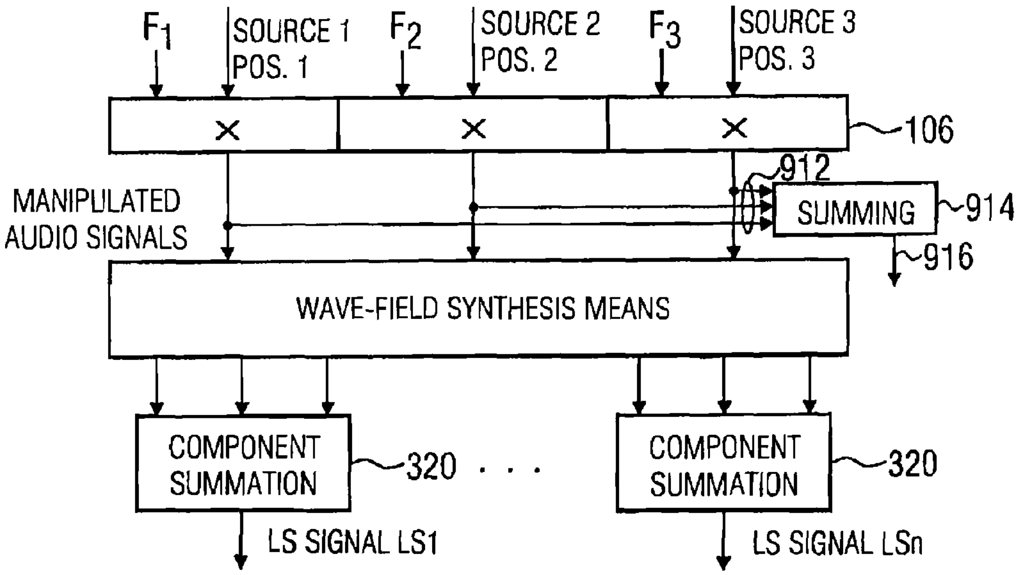
FIG. 6*b* is a block circuit diagram of a further embodiment of the present invention with an upstream manipulation means.

These two possibilities, which may be employed either alternatively or cumulatively, are depicted in FIGS. 6*a* and 6*b*. For example, FIG. 6*a* shows the embedded manipulation performed by manipulation means 106, which is drawn as a multiplier in FIG. 6*a*. A wave-field synthesis means, consisting, for example, of blocks 300, 310 and 302, 312 and 304, 314, and 306 and 316 of FIG. 3, respectively, provides component signals $K_{11}$, $K_{12}$, $K_{13}$ for loudspeaker LS1, and component signals $K_{n1}$, $K_{n2}$ and $K_{n3}$ for loudspeaker LSn, respectively.

In the notation selected in FIG. 6*a*, the first index of $K_{ij}$ indicates the loudspeaker, and the second index indicates the virtual source from which the component signal originates. Virtual source 1 is expressed, for example, in the component signal $K_{11}, \ldots, K_{n1}$. In order to selectively influence the level of virtual source 1 independently of the position information of virtual source 1 (without influencing the levels of the other virtual sources), a multiplication of the component signals belonging to source 1, i.e. of those component signals whose index j indicates the virtual source 1, by the correction factor $F_1$ will take place in the embedded manipulation shown in FIG. 6*a*. In order to perform a corresponding amplitude and/or level correction for virtual source 2, all component signals originating from virtual source 2 are multiplied by a correction factor $F_2$ specified for this purpose. Eventually, the component signals which originate from virtual source 3 will also be weighted by a respective correction factor $F_3$.

It shall be pointed out that the correction factors $F_1$, $F_2$ and $F_3$ depend merely on the position of the respective virtual source, when all other geometric parameters are the same. If, therefore, all three virtual sources were, e.g., point sources (i.e. of the same kind) and were located at the same position, the correction factors for the sources would be identical. This law will be explained in more detail below with reference to FIG. 4, since in order to reduce calculating time, it is possible to employ a look-up table with position information and correction factors associated respectively, which look-up tables indeed needs to be established at some point in time, but may be accessed fast during operation, without constantly having to perform a target-value/actual-value calculation and comparison operation during operation, which, however, is also possible in principle.

FIG. 6*b* shows the inventive alternative to source manipulation. The manipulation means here is connected upstream from the wave-field synthesis means and is operative to correct the audio signals of the sources with the respective correction factors so as to obtain manipulated audio signals for the virtual sources, which are then supplied to the wave-field synthesis means so as to obtain the component signals which are then summed by the respective component summation means to obtain the loudspeaker signals LS for the respective loudspeakers, such as loudspeaker $LS_i$.

In a preferred embodiment of the present invention, means 100 for determining the correction value is configured as a look-up table 400 which stores position/correction-factor value pairs. Means 100 is preferably also provided with an interpolation means 402 in order to keep the table size of look-up table 400 within certain limits, on the one hand, and to generate, on the other hand, an interpolated current correction factor at an output 408 also for current positions of a virtual source which are fed to the interpolation means via an input 404, at least using one or several adjacent position/correction-factor value pairs which are stored in the look-up table and are fed to the interpolation means 402 via an input 406. With a simpler version, the interpolation means 402 may also be omitted, however, so that means 100 for determining of FIG. 1 directly accesses the look-up table using position information supplied at an input 410, and provides a respective correction factor at an output 412. If the current position information associated with the audio track of the virtual source does not precisely match a piece of position information to be found in the look-up table, the look-up table may also have a simple round-down/round-up function associated with it so as to take the nearest support value stored in the table rather than the current support value.

It is to be noted at this point that different tables may be created for different kinds of sources, or that a position has not only one correction factor associated with it, but several correction factors, each correction factor being linked to a type of source.

Figure 4:
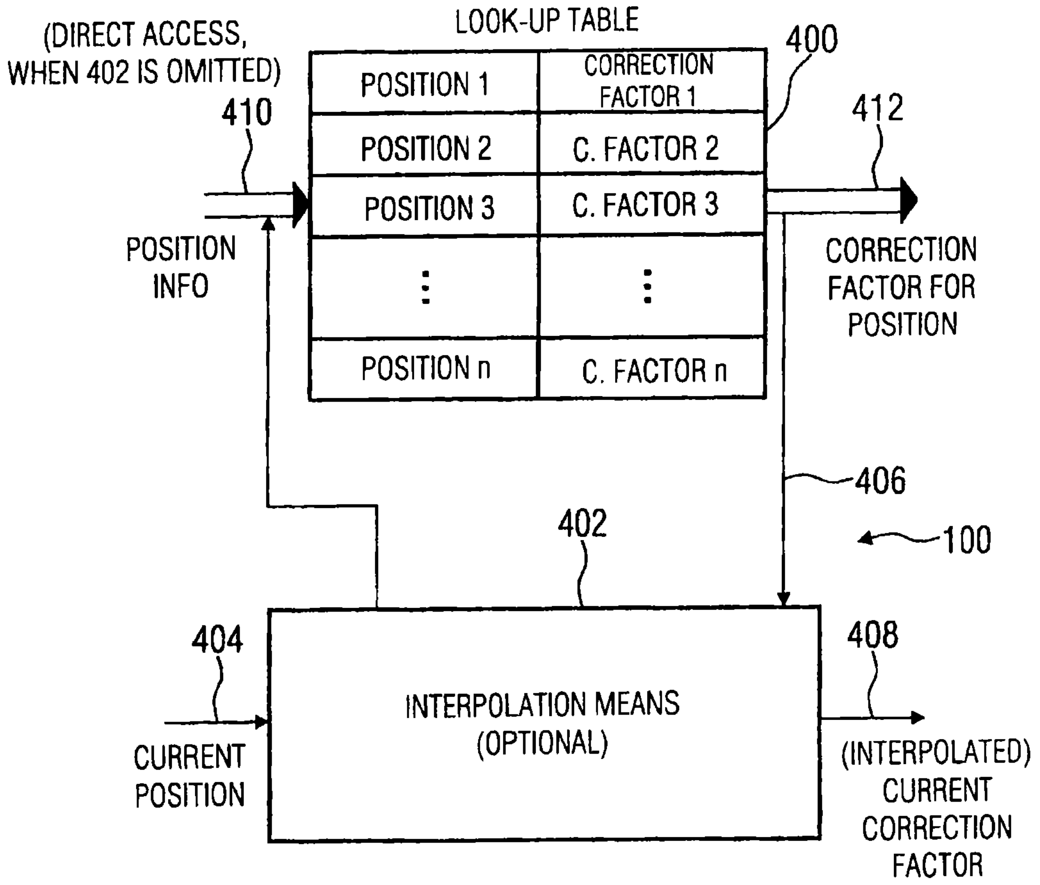
FIG. 4 is a block circuit diagram of an inventive means for determining the correction value in accordance with an embodiment with a look-up table and, if need be, an interpolation means.
Figure 5:
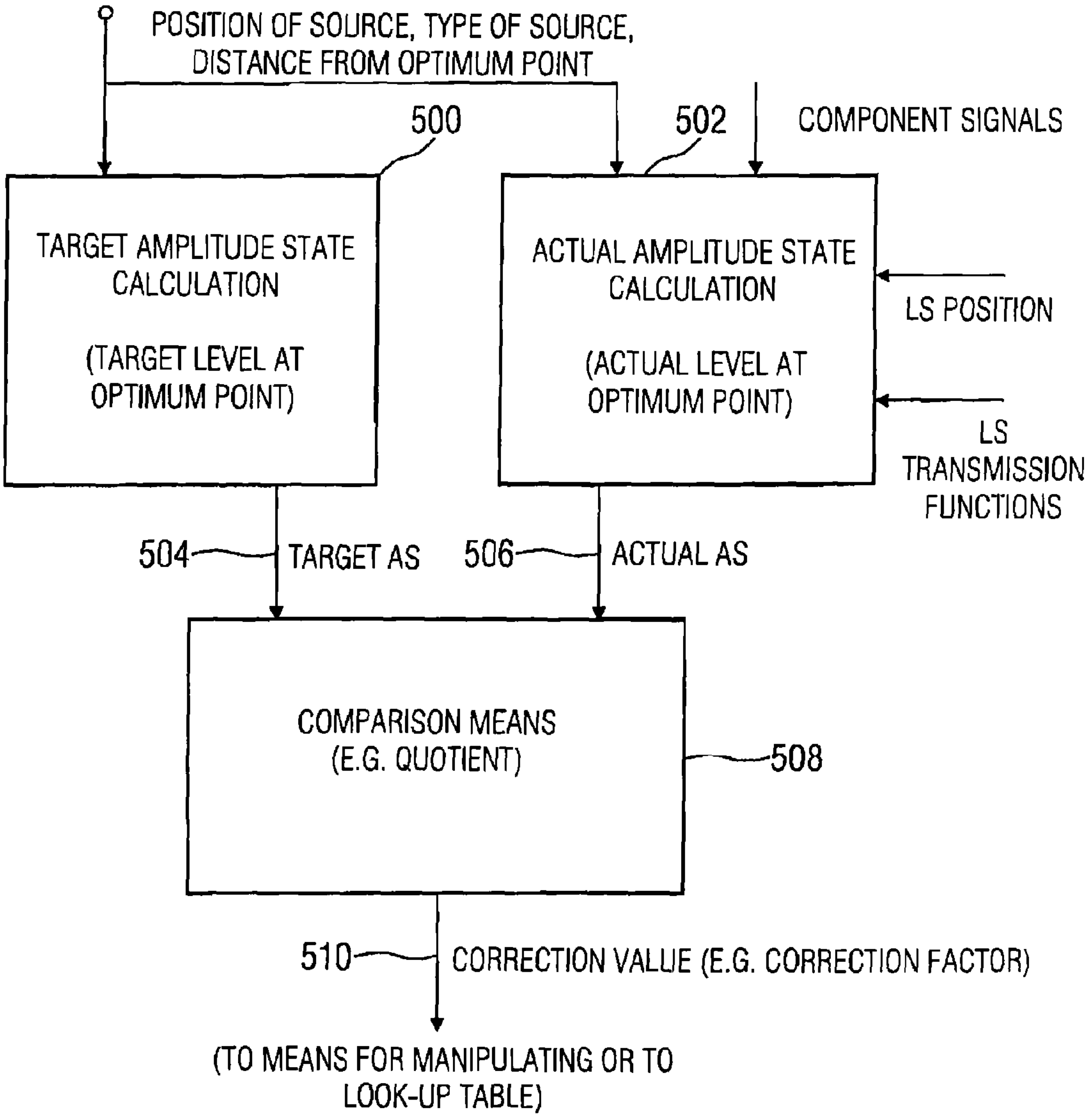
FIG. 5 is a further embodiment of the means for determining FIG. 1 with a determination of target value/actual value and with a subsequent comparison.

Alternatively, the means for determining may be configured to actually perform a target-value/actual-value comparison instead of the look-up table, or for "refilling" the look-up table in FIG. 4. In this case, means 100 of FIG. 1 includes a target amplitude state determination means 500 as well as an actual amplitude state determination means 502 so as to provide a target amplitude state 504 as well as an actual amplitude state 506 which are fed to a comparison means 508 which calculates, for example, a quotient from the target amplitude state 504 and the actual amplitude state 506 so as to generate a correction factor 510 which will be fed to means 106 for manipulating, shown in FIG. 1, for further use. Alternatively, the correction value may also be stored in a look-up table.

The target amplitude state calculation is configured to determine a target level at the optimum point for a virtual source configured at a certain position and/or as a certain type. For the target amplitude state calculation, the target amplitude state determination means 500 naturally requires no component signals, since the target amplitude state is independent of the component signals. However, as may be seen from FIG. 5, component signals are fed to the actual amplitude determination means 502, which additionally may obtain, depending on the embodiment, information about the loudspeaker positions as well as information about loudspeaker transmission functions and/or information about directional characteristics of the loudspeakers, so as to determine an actual situation as well as possible. The actual situation is determined for a zone in the presentation area, which extends around the predetermined point within a tolerance range having a radius smaller than 2 meters around the predetermined point. Alternatively, the actual amplitude state determination means 502 may also be configured as an actual measurement system so as to determine an actual level situation at the optimum point for certain virtual sources at certain positions.

The target sound level and the actual sound level are based on a measure of an energy falling onto a reference area within a period of time. Specifically, the determination means 502 for determining the correction value is configured to calculate the target amplitude state in that samples of the audio signal associated with the virtual source are squared sample by sample, and a number of squared samples, the number being a measure of an observation time, are summed to obtain the target amplitude state. And the correction value is formed by calculating the actual amplitude state in that each component signal is squared sample by sample, and a number of squared samples, which equals the number of some squared samples for calculating the target amplitude state, are added up, so that an additional result or each component signal is obtained, wherein the additional results from the component signals are further added up to obtain the actual amplitude state.

With regard to FIGS. 7*a* and 7*b*, reference shall be made below to the actual amplitude state and the target amplitude state, respectively. FIG. 7*a* shows a diagram for determining a target amplitude state at a predetermined point which is designated by "optimum point" in FIG. 7*a* and which is located within the presentation area 802 of FIG. 8. FIG. 7*a* shows a merely exemplary drawing of a virtual source 700 as a point source which generates a sound field with concentric wave fronts. In addition, the level $L_v$, of the virtual source 700 is known because of the audio signal for the virtual source 700. The target amplitude state and/or—if the amplitude state is a level state—the target level at point P in the presentation area is readily obtained due to the fact that level $L_p$ at point P equals the quotient from $L_v$ and a distance r at which point P is located from the virtual source 700. The target amplitude state may thus be readily determined by calculating level $L_v$, of the virtual source and by calculating the distance r between the optimum point and the virtual source. For calculating the distance r, a coordinate transformation of the virtual coordinates into the coordinates of the presentation room, or a coordinate transformation of the presentation-room coordinates of point P into the virtual coordinates must typically be performed, which is known to those skilled in the art of wave-field synthesis.

If, however, the virtual source is a virtual source which is located at an infinitely far distance and which generates plane waves at point P, the distance between point P and the source is not required for determining the target amplitude state since said distance goes toward infinity anyhow. In this case, what is required is only a piece of information about the type of the source. The target level at point P then equals that level which is associated to the plane wave field generated by the virtual source which is located at an infinitely far distance.

FIG. 7 shows a diagram for illustrating the actual amplitude state. In particular, FIG. 7*b* shows drawings of different loudspeakers 808 which are all fed a loudspeaker signal of their own which has been generated, e.g., by wave-field synthesis module 810 of FIG. 8. In addition, each loudspeaker is modeled as a point source which outputs a concentric wave field. The law of the concentric wave-fields in turn is that the level falls off in accordance with 1/r. This corresponds to the calculation of a damping value, for each loudspeaker, the damping value depending on the position of the loudspeaker and on a point to be contemplated in the presentation area. The component signal of a loudspeaker is weighted with the damping value for the loudspeaker so as to obtain a weighted component signal. Thus, for calculating the actual amplitude state (without measurement), the signal which is generated by loudspeaker 808 immediately at the loudspeaker diaphragm, and/or the level of said signal, may be calculated on the basis of the loudspeaker characteristics and the component signal in the loudspeaker signal LSn, which originates from the virtual source contemplated. In addition, due to the coordinates of point P and the location information about the position of loudspeaker LSn, the distance between P and the loudspeaker diaphragm of loudspeaker LSn may be calculated, so that a level for point P may be obtained on the basis of a component signal which originates from the virtual source contemplated and has been sent out by loudspeaker LSn.

A corresponding procedure may also be performed for the other loudspeakers of the loudspeaker array so that a number of "partial level values" result for point P which represent a signal contribution of the virtual source contemplated, the signal contribution having arrived from the individual loudspeakers to the listener at point P. By combining these partial level values, the overall actual amplitude state at point P is then obtained, which state may then be compared with the target amplitude state, as has been illustrated, so as to obtain a correction value which is preferably multiplicative, but may, in principle, also be additive or subtractive.

In accordance with the invention, the desired level for a point, i.e. the target amplitude state, is thus calculated on the basis of certain forms of sources. It is preferred for the optimum point and/or the point in the presentation area which is contemplated to be conveniently located in the center of the wave-field synthesis system. It is to be noted at this point that an improvement is achieved already in the event that the point which has been used as a basis for calculating the target amplitude state does not immediately match the point that has been used for determining the actual amplitude state. Since what is striven for is as good a level artefact reduction as possible for as many points in the presentation area as possible, it is sufficient, in principle, for a target amplitude state to be determined for any point in the presentation area, and for an actual amplitude state to also be determined for any point in the presentation area, it being preferred, however, that that point to which the actual amplitude state is related be located in a zone around that point for which the target amplitude state has been determined, this zone preferably being smaller than 2 meters for normal cinema applications. For best results, these points should substantially coincide.

In accordance with the invention, after calculating the individual levels of the loudspeakers in accordance with common wave-field synthesis algorithms, the level, which practically arises from superposition, at this point referred to as the optimum point in the presentation area is thus calculated. The levels of the individual loudspeakers and/or sources are then corrected with this factor, in accordance with the invention. For applications which are efficient in terms of calculating time, it is particularly preferred to calculate and then store correction factors once for all positions in a certain array arrangement so as to then access the table during operation so as to achieve savings in calculating time.

At this point, reference shall be made particularly to FIG. 6*b*, wherein means 914 for summing is drawn so as to provide the composite signal 916 at the output side, while at the input side, the scaled object signals 912 are obtained, which, as may be seen from FIG. 6*b*, are obtained by scaling the source signals of sources 1, 2, 3 with the respective audio object scaling values and/or correction values F1, F2, F3. It shall also be noted at this point that for the present invention of low-frequency channel generation, the version shown in FIG. 6*b* is preferred, wherein scaling and/or manipulation and/or correction is conducted at the audio object signal level already rather than at the component level, as is shown in FIG. 6*a*. Nevertheless, the concept shown in FIG. 6*a* of correcting at the component level could be combined with the inventive concept of low-frequency channel generation in that at least the calculation of the audio object scaling values F1, F2, . . . , Fn need only be performed once.

In accordance with the invention, the scaling of the subwoofer channel is thus conducted similarly to the scaling of the overall loudness of all loudspeakers in the reference point of the wave-field synthesis playback system. The inventive method is thus suitable for any number of subwoofer loudspeakers, which are all scaled such that they reach a reference loudness at the center of the wave-field synthesis system. The reference loudness here depends only on the position of the virtual sound source. With the known dependencies on the distance of the sound object from the reference point, and the associated damping of the loudness, what is preferably calculated is the individual loudness of the respective sound object for each subwoofer channel. The delay of each source is calculated from the distance of the virtual source from the reference point of the loudness scaling. Each subwoofer loudspeaker plays back the sum of all sound objects thus converted. The manner in which the individual loudnesses of the subwoofer loudspeakers add up depends on their positions. The preferred positioning of subwoofer loudspeakers and the choice of the number of subwoofers required are set forth in the above-mentioned specialist publications Welti, Todd, "How Many Subwoofers are Enough", 112$^{th}$ AES Conv. Paper 5602, May 2002, Munich, Germany, Martens, "The impact of decorrelated low-frequency reproduction on auditory spatial imagery: Are two subwoofers better than one?", 16$^{th}$ AES Conf. Paper, April 1999, Rovaniemi, Finland.

Depending on the circumstances, the inventive method for generating a low-frequency channel, as is represented by means of FIG. 9, may be implemented in hardware or in software.

Depending on the circumstances, the inventive method for level correction, as represented in FIG. 1, may be implemented in hardware or in software. The implementation may be effected on a digital storage medium, in particular a disc or CD with electronically readable control signals which may cooperate with a programmable computer system in such a manner that the method is performed. Generally, the invention thus also consists in a computer-program product with a program code, stored on a machine-readable carrier, for performing the method for level correction, when the computer program runs on a computer. In other words, the invention thus may be realized as a computer program having a program code for performing the method, when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for generating a low-frequency channel for a low-frequency loudspeaker, comprising:

a first provider for providing a plurality of audio objects, the plurality of audio objects comprising at least a first audio object and a second audio object, each audio object having an object signal and an object description associated with the object signal;

a calculator for calculating an audio object scaling value for each audio object in dependence on the object description associated with the object signal so that at least a first audio object scaling value for the first audio object and a second audio object scaling value for the second audio object is obtained;

a scaler for scaling each object signal with an associated audio object scaling value so as to obtain at least a first scaled object signal for the first audio object and a second scaled object signal for the second audio object;

a summer for summing at least the first scaled object signal and the second scaled object signal so as to obtain a composite signal; and a second provider for providing the low-frequency channel for the low-frequency loudspeaker on the basis of the composite signal.

2. The apparatus as claimed in claim 1, wherein the low-frequency loudspeaker is arranged at a predetermined loudspeaker position, the predetermined loudspeaker position differing from a reference playback position, and wherein the second provider for providing the low-frequency channel is configured to calculate a loudspeaker scaling value for the low-frequency loudspeaker in dependence on the predetermined loudspeaker position, so that a low-frequency signal at the reference playback position has a loudness which corresponds to a loudness of the composite signal within a predetermined tolerance range, and wherein the provider is further configured to scale the composite signal with the loudspeaker scaling value so as to generate the low-frequency channel.

3. The apparatus as claimed in claim 2, wherein several low-frequency loudspeakers are provided, and wherein the second provider is further configured to calculate the loudspeaker scaling values such that for each low-frequency loudspeaker, a loudspeaker scaling value in accordance with the following equation is obtained:

$$(a_1+a_2+\ldots+a_n)\cdot s=LS\mathrm{ref},$$

wherein LSref is a reference loudness at a reference playback position, wherein s is the composite signal, wherein $a_1$ is the loudspeaker scaling value of a first low-frequency loudspeaker, wherein $a_2$ is a loudspeaker scaling value of a second low-frequency loudspeaker, and wherein $a_n$ is a loudspeaker scaling value of an $n^{th}$ low-frequency loudspeaker.

4. The apparatus as claimed in claim 3, wherein the loudspeaker scaling value of a low-frequency loudspeaker depends on a distance of the low-frequency loudspeaker from the reference playback position.

5. The apparatus as claimed in claim 1, wherein each object signal is a low-frequency signal having an upper cutoff frequency smaller than or equal to 250 Hz.

6. The apparatus as claimed in claim 1, wherein the composite signal has an upper cutoff frequency higher than 8 kHz, and wherein the second provider for providing the low-frequency channel is configured to conduct a low-pass filtering at a cutoff frequency smaller than or equal to 250 Hz.

7. The apparatus as claimed in claim 1, wherein an audio object of the plurality of audio objects includes an object description which includes an audio object position, and wherein the calculator for calculating an audio object scaling value for the audio object is configured to calculate the audio object scaling value in dependence on the audio object position of the audio object and on a reference playback position, and in dependence on an object loudness associated with the audio object.

8. The apparatus as claimed in claim 1, wherein a plurality of low-frequency channels for a plurality of low-frequency loudspeakers may be generated at predetermined low-frequency loudspeaker positions, and wherein the second provider is configured to calculate a loudspeaker scaling value for each low-frequency loudspeaker in dependence on the position of a low-frequency loudspeaker and in dependence on a number of further low-frequency loudspeakers, so that a low-frequency signal which is superposition of output signals of all low-frequency loudspeakers at the reference position has a loudness which corresponds to a loudness of the composite signal within a predetermined tolerance range.

9. The apparatus as claimed in claim 1, wherein the calculator for calculating audio object scaling values is further configured to calculate an audio object delay value for each audio object, the former depending on an object position and a reference playback position, and wherein the summer is configured to delay each object signal or each scaled object signal by the respective audio object delay value prior to summing.

10. The apparatus as claimed in claim 1, wherein the first provider is configured to calculate, for a low-frequency loudspeaker, a low-frequency loudspeaker delay value which depends on a distance of the low-frequency loudspeaker from the reference playback position, and wherein the second provider is further configured to take into account the low-frequency loudspeaker delay value when providing the low-frequency channel.

11. The apparatus as claimed in claim 1, which is configured to operate in a wave-field synthesis system with a wave-field synthesis module and an array of loudspeakers for exposing a presentation area to sound, the wave-field synthesis module being configured to receive an audio signal associated with a virtual sound source, as well as source position information associated with the virtual sound source, and to calculate component signals for the loudspeakers due to the virtual source while taking into account loudspeaker position information, and wherein the calculator for calculating the audio object scaling values includes a determiner for determining a correction value as an audio object scaling value, the determiner being configured to calculate the audio object scaling value such that it is based on a target amplitude state in the presentation area, the target amplitude state depending on a position of the virtual source or a type of the virtual source, and such that it is further based on an actual amplitude state in the presentation area which is based on the component signals for the loudspeakers due to the virtual source.

12. The apparatus as claimed in claim 11, wherein the determiner for determining the correction value is configured to calculate the target amplitude state for a predetermined point in the presentation area, and to determine the actual amplitude state for a zone in the presentation area which equals the predetermined point or extends around the predetermined point within a tolerance range.

13. The apparatus as claimed in claim 12, wherein the predetermined tolerance range is a sphere having a radius smaller than 2 meters around the predetermined point.

14. The apparatus as claimed in claim 11, wherein the virtual source is a source for plane waves, and wherein the determiner for determining the correction value is configured to determine a correction value wherein an amplitude state of the audio signal associated with the virtual source equals the target amplitude state.

15. The apparatus as claimed in claim 11, wherein the virtual source is a point source, and wherein the determiner for determining the correction factor is configured to operate on the basis of a target amplitude state which equals a quotient from an amplitude state of the audio signal associated with the virtual source, and the distance between the presentation area and the position of the virtual source.

16. The apparatus as claimed in claim 11, wherein the determiner for determining the correction value is configured to operate on the basis of an actual amplitude state, the determination of which takes into account a loudspeaker transmission function of the loudspeaker.

17. The apparatus as claimed in claim 11, wherein the determiner for determining the correction factor is configured to calculate, for each loudspeaker, a damping value which depends on the position of the loudspeaker and on a point to be contemplated in the presentation area, and wherein the determiner is further configured to weight the component signal of a loudspeaker with the damping value for the loudspeaker so as to obtain a weighted component signal and so as to further sum component signals or component signals, weighted accordingly, from other loudspeakers so as to obtain the actual amplitude state at the point contemplated on which the correction value is based.

18. The apparatus as claimed in claim 11, wherein the manipulator is configured to use that correction value as a correction factor which equals a quotient from the actual amplitude state and the target amplitude state.

19. The apparatus as claimed in claim 11, wherein the target amplitude state is a target sound level, and wherein the actual amplitude state is an actual sound level.

20. The apparatus as claimed in claim 19, wherein the target sound level and the actual sound level are based on a measure of an energy falling onto a reference area within a period of time.

21. The apparatus as claimed in claim 19, wherein the determiner for determining the correction value is configured to calculate the target amplitude state in that samples of the audio signal associated with the virtual source are squared sample by sample, and a number of squared samples, the number being a measure of an observation time, are summed to obtain the target amplitude state, and wherein the determiner for determining the correction value is further configured to calculate the actual amplitude state in that each component signal is squared sample by sample, and a number of squared samples, which equals the number of summed squared samples for calculating the target amplitude state, are added up so that an addition result for each component signal is obtained, and wherein the addition results from the component signals are further added up to obtain the actual amplitude state.

22. The apparatus as claimed in claim 11, wherein the determiner for determining the correction value comprises a look-up table which has position/correction-factor value pairs stored therein, a correction factor of a value pair depending on an arrangement of the loudspeakers in the array of loudspeakers, and on a position of a virtual source, and the correction factor being selected such that a deviation between an actual amplitude state due to the virtual source at the associated position and a target amplitude state is at least reduced when the correction factor is used by the manipulator.

23. The apparatus as claimed in claim 22, wherein the determiner is further configured to interpolate a current correction factor for a current position of the virtual source from one or several correction factors from position/correction-factor value pairs, whose position(s) is/are located adjacent to the current position.

24. A method for generating a low-frequency channel for a low-frequency loudspeaker, comprising:

providing a plurality of audio objects, the plurality of audio objects comprising at least a first audio object and a second audio object, each audio object having an object signal and an object description associated with the object signal;

calculating an audio object scaling value for each audio object in dependence on the object description associated with the object signal so that at least a first audio object scaling value for the first audio object and a second audio object scaling value for the second audio object is obtained;

scaling each object signal with an associated audio object scaling value so as to obtain at least a first scaled object signal for the first audio object and a second scaled object signal for the second audio object;

summing at least the first scaled object signal and the second scaled object signal so as to obtain a composite signal; and providing the low-frequency channel for the low-frequency loudspeaker on the basis of the composite signal.

25. A computer program having a program code for performing the method for generating a low-frequency channel for a low-frequency loudspeaker, the method comprising:

providing a plurality of audio objects, the plurality of audio objects comprising at least a first audio object and a second audio object, each audio object having an object signal and an object description associated with the object signal;

calculating an audio object scaling value for each audio object in dependence on the object description associated with the object signal so that at least a first audio object scaling value for the first audio object and a second audio object scaling value for the second audio object is obtained;

scaling each object signal with an associated audio object scaling value so as to obtain at least a first scaled object signal for the first audio object and a second scaled object signal for the second audio object;

summing at least the first scaled object signal and the second scaled object signal so as to obtain a composite signal; and providing the low-frequency channel for the low-frequency loudspeaker on the basis of the composite signal, when the program runs on a computer.

* * * * *

UNITED STATES PATENT AND TRADEMARK OFFICE

CERTIFICATE OF CORRECTION

PATENT NO. : 8,699,731 B2
APPLICATION NO. : 11/440853
DATED : April 15, 2014
INVENTOR(S) : Michael Beckinger et al.

It is certified that error appears in the above-identified patent and that said Letters Patent is hereby corrected as shown below:

On the title page, item (73), assignee name, please replace "Fraunhofer-Gesellschaft zur Forderung der Angewandten Forschung E.V." with "Fraunhofer-Gesellschaft zur Foerderung der angewandten Forschung e.V."

Signed and Sealed this
Fourteenth Day of October, 2014

Michelle K. Lee
*Deputy Director of the United States Patent and Trademark Office*